(12) United States Patent
Shiraishi

(10) Patent No.: US 11,070,238 B2
(45) Date of Patent: Jul. 20, 2021

(54) DECODING DEVICE AND DECODING METHOD

(71) Applicant: SONY SEMICONDUCTOR SOLUTIONS CORPORATION, Kanagawa (JP)

(72) Inventor: Junya Shiraishi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/765,035

(22) PCT Filed: Oct. 11, 2018

(86) PCT No.: PCT/JP2018/037878
§ 371 (c)(1),
(2) Date: May 18, 2020

(87) PCT Pub. No.: WO2019/102733
PCT Pub. Date: May 31, 2019

(65) Prior Publication Data
US 2020/0366319 A1 Nov. 19, 2020

(30) Foreign Application Priority Data
Nov. 27, 2017 (JP) .............................. JP2017-227015

(51) Int. Cl.
*H03M 7/34* (2006.01)
*H03M 13/00* (2006.01)
(Continued)

(52) U.S. Cl.
CPC ....... *H03M 13/6331* (2013.01); *H03M 13/41* (2013.01); *G11B 20/14* (2013.01); *G11B 20/18* (2013.01)

(58) Field of Classification Search
CPC .. H03M 13/41; H03M 13/39; H03M 13/4107; H03M 13/23; H03M 13/395;
(Continued)

(56) References Cited

U.S. PATENT DOCUMENTS 6,119,265 A 9/2000 Hara
6,862,552 B2 3/2005 Goldstein et al.
(Continued)

FOREIGN PATENT DOCUMENTS

CN 101310495 A 11/2008
CN 103503071 A 1/2014
(Continued)

OTHER PUBLICATIONS

International Search Report and Written Opinion of PCT Application No. PCT/JP2018/037878, dated Nov. 6, 2018, 08 pages of ISRWO.
(Continued)

*Primary Examiner* — Linh V Nguyen
(74) *Attorney, Agent, or Firm* — Chip Law Group

(57) ABSTRACT

Deterioration of convergence performance or operational stability due to an increase in constraint length is suppressed when coefficients are updated, so that decoding performance is improved. A decoding device according to the present technology includes an adaptive equalization unit that performs adaptive equalization, an adaptive maximum likelihood decoding unit that causes an identification point of maximum likelihood decoding to adaptively follow a characteristic of an input signal, a target waveform generation unit that, by convoluting a partial response coefficient into a decoded value, generates an equalization target waveform of the adaptive equalization which is performed by the adaptive equalization unit, an error signal generation unit that generates, as an equalization error signal, an error signal
(Continued)

between the equalization target waveform and an equalized signal, and a coefficient updating unit that, through least-square-method computation for minimizing a correlation between the decoded value and the equalization error signal, updates the partial response coefficient which is used by the target waveform generation unit to generate the equalization target waveform.

10 Claims, 16 Drawing Sheets

(51) Int. Cl.
*H03M 13/41* (2006.01)
*G11B 20/14* (2006.01)
*G11B 20/18* (2006.01)

(58) Field of Classification Search
CPC ............ H03M 13/413; H03M 13/4161; H03M 13/4169; H03M 13/4192; H03M 13/6331; H03M 13/6337; H03M 13/6343; H03M 13/6502; H03M 13/6516; H03M 13/6561; H03M 5/145; H03M 7/46; H03M 13/2957; H03M 13/3723; H03M 13/45; H03M 13/6591; G11B 20/10009; G11B 20/10046; G11B 20/14; G11B 20/18; G11B 2020/00065; G11B 2020/1287; G11B 20/10; G11B 20/10425; G11B 20/10212; G11B 20/1426; G11B 20/10055; G11B 20/10148; G11B 20/10277; H04L 1/0054; H04L 25/497; H04L 1/0047; H04L 1/0071; H04L 25/03038
USPC .............................................. 341/51, 58, 59
See application file for complete search history.

(56) References Cited

U.S. PATENT DOCUMENTS

| 7,274,645 B2* | 9/2007 | Urita .................. G11B 7/005 |
| | | 369/53.35 |
| 7,917,563 B1* | 3/2011 | Shih ................ G11B 20/10046 |
| | | 708/322 |
| 8,773,793 B1 | 7/2014 | Mcfadyen |
| 9,118,518 B2 | 8/2015 | Erez et al. |
| 2004/0100714 A1* | 5/2004 | Berman ................ G11B 5/035 |
| | | 360/65 |
| 2004/0247026 A1* | 12/2004 | Kochale ................ H03M 7/46 |
| | | 375/232 |
| 2005/0094304 A1* | 5/2005 | Ohkubo ........... G11B 20/10055 |
| | | 360/65 |
| 2007/0237059 A1 | 10/2007 | Kasahara |
| 2008/0253438 A1 | 10/2008 | Riani et al. |
| 2009/0319876 A1* | 12/2009 | Chiba ................ H03M 13/395 |
| | | 714/794 |
| 2010/0142338 A1* | 6/2010 | Kobayashi ........... G11B 7/0062 |
| | | 369/47.15 |
| 2011/0093517 A1* | 4/2011 | Liu .................. G11B 20/10481 |
| | | 708/207 |
| 2011/0110210 A1* | 5/2011 | Honma ........... G11B 20/10509 |
| | | 369/47.15 |
| 2013/0250744 A1* | 9/2013 | Higashino ........... G11B 7/00458 |
| | | 369/47.17 |
| 2014/0043950 A1 | 2/2014 | Omaki et al. |
| 2016/0284380 A1* | 9/2016 | Nakata ............ G11B 20/10009 |

FOREIGN PATENT DOCUMENTS

| EP | 1952601 A2 | 8/2008 |
| JP | 3033238 B2 | 4/2000 |
| JP | 3246349 B2 | 1/2002 |
| JP | 2009-516459 A | 4/2009 |
| JP | 2011-165245 A | 8/2011 |
| JP | 2011-170930 A | 9/2011 |
| JP | 2013-012264 A | 1/2013 |
| JP | 5623097 B2 | 11/2014 |
| JP | 5766281 B2 | 8/2015 |
| KR | 10-2008-0069696 A | 7/2008 |
| KR | 10-2013-0135978 A | 12/2013 |
| TW | 200731703 A | 8/2007 |
| WO | 2007/057824 A2 | 5/2007 |
| WO | 2012/147392 A1 | 11/2012 |
| WO | 2013/183385 A1 | 12/2013 |

OTHER PUBLICATIONS

Extended European Search Report of EP Application No. 18880513.9, dated Dec. 9, 2020, 09 pages.

* cited by examiner

DECODING DEVICE AND DECODING METHOD

CROSS REFERENCE TO RELATED APPLICATIONS

This application is a U.S. National Phase of International Patent Application No. PCT/JP2018/037878 filed on Oct. 11, 2018, which claims priority benefit of Japanese Patent Application No. JP 2017-227015 filed in the Japan Patent Office on Nov. 27, 2017. Each of the above-referenced applications is hereby incorporated herein by reference in its entirety.

TECHNICAL FIELD

The present technology relates to the technical field of decoding devices and decoding methods for decoding data through PRML decoding (PRML: Partial Response Maximum Likelihood).

BACKGROUND ART

For example, in high-density magnetic recording reproduction devices and optical recording reproduction devices, PRML decoding has been commonly used for performing binary decoding of information signals read out from a recording medium. A PRML decoding device includes a partial response equalization circuit and a maximum likelihood decoding circuit.

In a partial response equalization circuit, adaptive equalization of adaptively controlling an equalization characteristic close to ideal partial response has been commonly used in order to follow variation of recording performances or variation of reproduction states.

However, transmission channels for magnetic recording and reproduction or for optical recording and reproduction are rarely regarded as completely ideal partial response transmission channels. Even when adaptive equalization is performed, there is still a disadvantage that deviation from an ideal value is generated.

In maximum likelihood decoding circuits, a Viterbi algorithm for determining a most likely decoded data stream for each sample time on the basis of the history of the likelihood of decoded data, is commonly used. Such a maximum likelihood decoding circuit is also referred to as a Viterbi decoding circuit.

Further, in order to correct a deviation (equalization error) at a portion, of a transmission channel, which is not an ideal partial response transmission channel, vertical asymmetry (asymmetry) of an RF waveform caused by non-linearity, and a distortion component that can be generated in both optical and electrical systems, an adaptive Viterbi circuit for adaptively controlling an identification point of an input stage of a Viterbi decoding circuit according to inputted data, is also used in high-density recording/reproduction circuits.

A configuration example of the adaptive Viterbi circuit is disclosed in PTL 1. PTL 1 describes a PR class in which the constraint length (inter-code interference length) of PR (partial response) is 2 or 3. However, even for PR in which a constraint length is 4 or greater, a method for updating an identification point (amplitude reference level) can be generalized.

In addition, PTL 2 discloses a configuration using an adaptive Viterbi circuit as a Viterbi decoding circuit while using an adaptive equalization circuit for performing, as partial response equalization, the aforementioned adaptive equalization. That is, this configuration uses both an adaptive equalization circuit and an adaptive Viterbi circuit. Specifically, in PTL 2, a target value of adaptive equalization at an adaptive equalization circuit is substituted with an amplitude reference level (identification point) being controlled by an adaptive Viterbi circuit, and an equalization error (an error between an output from the equalization circuit and the target value) that is used to perform LMS (least squares method) computation for updating a PR coefficient is calculated. In the adaptive equalization circuit, a PR coefficient for minimizing the equalization error is set (updated) through this LMS computation.

CITATION LIST

Patent Literature

[PTL 1]
Japanese Patent No. 324349
[PTL 2]
Japanese Patent Laid-Open No. 2011-165245

SUMMARY

Technical Problem

However, if, as a configuration using both an adaptive equalization circuit and an adaptive Viterbi circuit, a configuration in which a target value of adaptive equalization at an adaptive equalization circuit is substituted with an identification point being adaptively controlled by an adaptive Viterbi circuit as in PTL 2 is adopted, it may be impossible to address a case in which a constraint length of PR is set to be long. In order to address a recent increase in recoding density, for example, the existing constraint lengths are 10 or greater. For example, in a case in which a constraint length=11, the number of identification points which are controlled by an adaptive Viterbi circuit becomes large enough to reach 288. Under the presupposition that many identification points (equalization target values) are handled, it is very difficult to cause proper convergence to a linear equalization target which is expressed by 11 PR coefficients, and to perform a stable operation.

The present technology has been made in view of the aforementioned circumstances, and an object thereof is to, when updating coefficients, suppress deterioration of convergence performance or operational stability due to an increase in constraint length, thereby improving decoding performance.

Solution to Problem

A decoding device according to the present technology includes: an equalization unit that performs, on an input signal, partial response equalization involving convolution of a partial response coefficient, the equalization unit being an adaptive equalization unit that performs adaptive equalization to cause the partial response coefficient to adaptively follow a characteristic of the input signal; a maximum likelihood decoding unit that performs maximum likelihood decoding on an equalized signal, which is a resultant signal obtained by equalization of the input signal at the adaptive equalization unit, and outputs a decoded value, the maximum likelihood decoding unit being an adaptive maximum likelihood decoding unit that causes an identification point of the maximum likelihood decoding to adaptively follow a characteristic of the input signal; a target waveform generation unit that, by convoluting the partial response coefficient into the decoded value, generates an equalization target waveform of the adaptive equalization which is performed by the adaptive equalization unit; an error signal generation unit that generates, as an equalization error signal, an error signal between the equalization target waveform and the equalized signal; and a coefficient updating unit that, through least-square-method computation for minimizing a correlation between the decoded value and the equalization error signal, updates the partial response coefficient which is used by the target waveform generation unit to generate the equalization target waveform.

Since the configuration using both adaptive equalization and adaptive maximum likelihood decoding is adopted, an equalization target that seems to be optimal for variation in characteristics of input signals is automatically set, so that stable decoding performance can be maintained.

In addition, since the configuration of feeding back the error signal between the equalized signal and the equalization target waveform to the adaptive equalization unit is adopted, any identification point of the adaptive maximum likelihood decoding unit does not need to be used during the adaptive equalization. Thus, this brings about an advantageous to an increase in constraint length.

Moreover, since, in the configuration using both adaptive equalization and adaptive maximum likelihood decoding, a partial response coefficient (hereinafter, "partial response" is sometimes referred to as "PR") which is used to generate the equalization target waveform is updated through least-square-method computation for minimizing the correlation between the decoded value and the equalization error signal, the PR coefficient is properly updated so as to be adapted to the characteristic of the input signal.

The above decoding device according to the present technology, may further include a sum-of-coefficients control unit that calculates a sum of partial response coefficients which are used to generate the equalization target waveform, and controls an updating operation at the coefficient updating unit such that the sum falls within a fixed range.

Accordingly, convergence of a PR coefficient so as to reduce the sum of PR coefficients (i.e., the amplitude of an equalized signal) to 0 through least-square-method computation, is prevented.

In the above decoding device according to the present technology, the sum-of-coefficients control unit may perform control to adjust the sum within the fixed range by giving an offset corresponding to a magnitude of the sum to the equalization error signal inputted to the coefficient updating unit.

Accordingly, it is unnecessary to adopt a configuration for, when performing control to keep the sum of PR coefficients within the fixed range, performing gain adjustment separately for the multipliers that are for convoluting PR coefficients during generation of the equalization target waveform.

The above decoding device according to the present technology may further include an error signal equalization unit that performs equalization on the equalization error signal inputted to the coefficient updating unit.

Accordingly, a frequency characteristic of the equalization error signal which is used to update a PR coefficient can be adjusted, so that the convergence value of the PR coefficient can be adjusted.

In the above decoding device according to the present technology, the error signal equalization unit may amplify a high-frequency component of the equalization error signal.

Accordingly, the value of a PR coefficient is converged such that an equalization characteristic with a greater high-frequency gain is obtained as an equalization characteristic of the adaptive equalization unit, so that decoding performance can be improved.

In the above decoding device according to the present technology, a delayer for delaying the decoded value by one clock may be shared by the coefficient updating unit and the target waveform generation unit.

Accordingly, when the configuration for updating a PR coefficient through least-square-method computation for minimizing the correlation between a decoded value and an equalization error signal is implemented, the circuit configuration can be simplified.

In the above decoding device according to the present technology, the coefficient updating unit may be configured such that the number of partial response coefficients to be updated by the coefficient updating unit is changeable.

Accordingly, a PR coefficient can be updated according to various constraint lengths.

In the above decoding device according to the present technology, the coefficient updating unit may change the number of partial response coefficients to be updated, by controlling actuation/stop of a multiplier which is used to update a partial response coefficient.

Accordingly, it is unnecessary to adopt a configuration in which a coefficient updating circuit for updating a PR coefficient is provided for each constraint length which is desired to be handled. To become adaptable to a plurality of PR classes in which constraint lengths are different, it is sufficient to provide a single coefficient updating circuit.

Further, a decoding method according to the present technology includes: an equalization step of performing, on an input signal, partial response equalization involving convolution of a partial response coefficient, the equalization step being an adaptive equalization step of performing adaptive equalization to cause the partial response coefficient to adaptively follow a characteristic of the input signal; and a maximum likelihood decoding step of performing maximum likelihood decoding on an equalized signal, which is a resultant signal obtained by equalization of the input signal in the adaptive equalization step, and of outputting a decoded value, the maximum likelihood decoding step being an adaptive maximum likelihood decoding step of causing an identification point of the maximum likelihood decoding to adaptively follow a characteristic of the input signal. The decoding method further includes: a target waveform generation step of, by convoluting the partial response coefficient into the decoded value, generating an equalization target waveform of the adaptive equalization which is performed in the adaptive equalization step; an error signal generation step of generating, as an equalization error signal, an error signal between the equalization target waveform and the equalized signal; and a coefficient updating step of, through least-square-method computation for minimizing a correlation between the decoded value and the equalization error signal, updating the partial response coefficient which is used to generate the equalization target waveform in the target waveform generation step.

Also by the decoding method according to the present technology, the functions similar to those provided by the aforementioned decoding device according to the present technology can be obtained.

Advantageous Effects of Invention

According to the present technology, deterioration of convergence performance or operational stability due to an increase in constraint length can be suppressed when coefficients are updated, so that decoding performance can be improved.

It is to be noted that the effects described here are not necessarily limitative, and any one of the effects disclosed herein may be provided.

DESCRIPTION OF EMBODIMENTS

Figure 1:
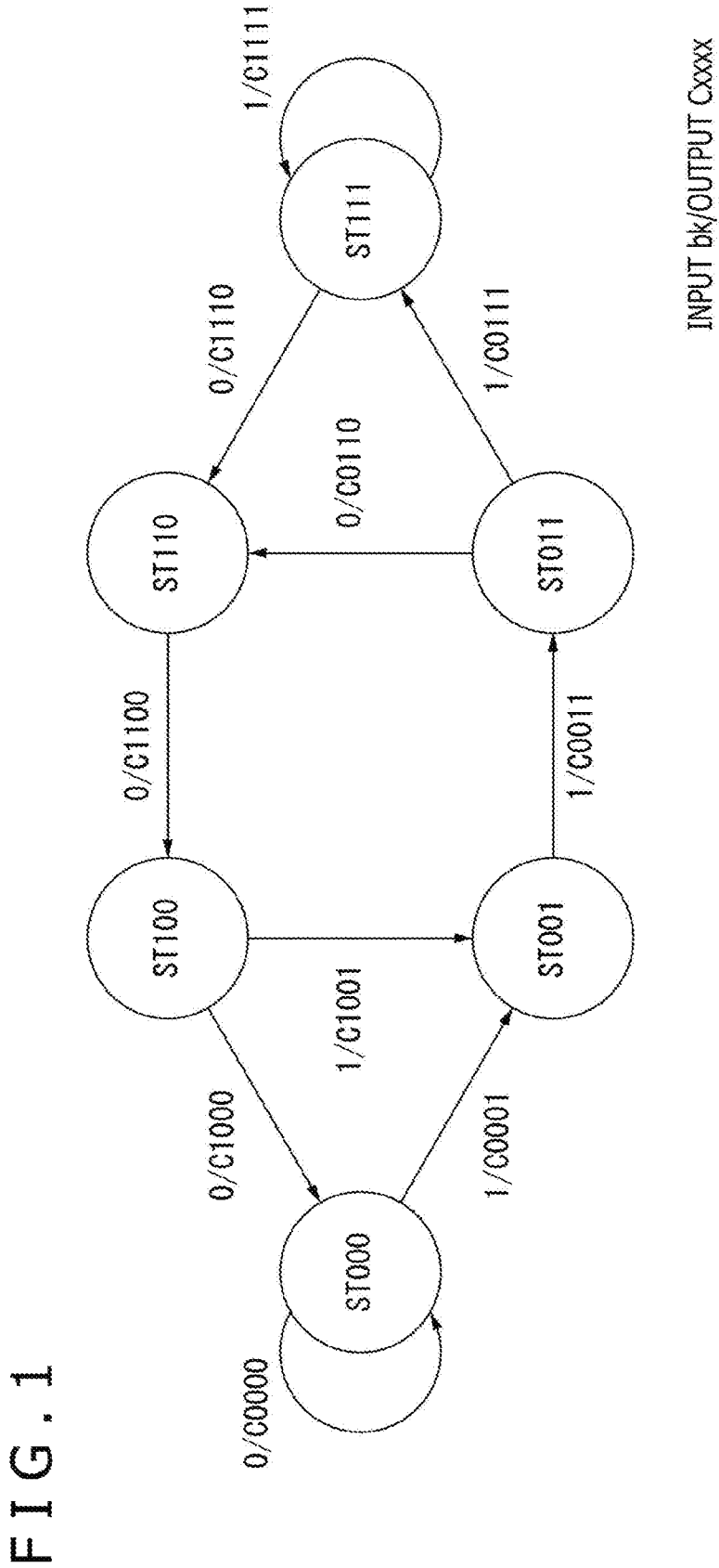
FIG. 1 is an explanatory diagram of state transition in the case of PR(1,x,x,1).

Hereinafter, an embodiment according to the present technology will be explained in accordance with the following order with reference to the attached drawings.
<1. Overview of PRML Decoding>
<2. Disc Drive Device>
<3. Configuration of Decoding Unit>
<4. Conclusion of Embodiment>
<5. Present Technology>
<1. Overview of PRML Decoding>

Prior to an explanation of a configuration of a decoding device according to the present technology, an explanation will be given of an overview of PRML decoding (partial response maximum likelihood decoding, PRML is an abbreviation of Partial Response Maximum Likelihood), with reference to FIGS. 1 and 2.

It is to be noted that a case where a partial response class (PR class) in which PR(1,x,x,1) is selected, a Run Length Limited code such as an RLL(1,7) code is used, and a minimum run length is limited to 1, will be explained herein.

"2," "3," or the like, which is suited for the optical characteristics, etc., is selected as x in PR(1,x,x,1). Hereinafter, a case where PR(1,2,2,1) is discussed, for example.

A PRML decoding method is a method for detecting a PR sequence in which the Euclidean distance to a reproduction signal becomes minimum, and is a technology which is a combination of a process that is called PR and a process that is called maximum likelihood detection.

A PR sequence is obtained by performing, on a bit sequence, weighted summation which is defined by a target response. For example, PR(1,2,2,1) returns, as a PR value, a value obtained by weighting 1,2,2,1 to a bit sequence and summing the results.

PR is a process of returning an output longer than 1 bit in response to a 1-bit input. A process of obtaining, as a reproduction signal, a signal obtained by sequentially multiplying inputted 4 consecutive information bits with 1, 2, 2, 1, and summing the results, is expressed as PR(1,2,2,1).

In addition, maximum likelihood detection is a method of defining a distance, which is referred to as Euclidean distance, between two signals, obtaining the distance from an actual signal to a signal that is predicted from an assumed bit sequence, and thereby detecting a bit sequence for minimizing the distance. It is to be noted that, here, a distance obtained by calculating the square of an amplitude difference between two signals of the same time and summing the respective squares of all the times, is defined as the Euclidean distance. Also, Viterbi detection (described later) is used in searching for a bit sequence for minimizing such a distance.

In PR maximum likelihood detection which is a combination of PR and maximum likelihood detection, an input signal is adjusted by a PR process using a filter serving as an equalizer, the Euclidean distance between the obtained reproduction signal and a PR of a predicted bit sequence is obtained, and a bit sequence for minimizing the distance is detected.

An algorithm using the previously described Viterbi detection becomes effective in actually searching for a bit sequence for minimizing the Euclidean distance.

In Viterbi detection, a Viterbi detector that includes a plurality of states each having units of consecutive bits having a predetermined length and includes branches expressed by transition therebetween is used, and a desired bit sequence is efficiently detected from among all possible bit sequences.

In an actual circuit, for each state, two registers: a register that is referred to as a path metric register and is for storing the Euclidean distance (path metric) of a PR sequence and a signal to the state; and a register that is referred to as a path memory register and is for storing a flow of a bit sequence (path memory) to the state, are prepared. In addition, for each branch, a computation unit that is referred to as a branch metric unit and is for calculating the Euclidean distance of a PR sequence and a signal in the bit, is prepared.

State transition in the case of PR(1,x,x,1) is depicted in FIG. 1.

In a case where a data bit stream is bk∈{0,1}, state transition of a PR output dk thereof is performed as depicted in FIG. 1. dk is outputted upon a transition from each state to the following state.

In FIG. 1, ST000 to ST111 represent states, and Cxxxx represents an output. Output Cxxxx represents an output obtained upon a state transition.

For example, it is assumed that the initial state is state ST000. When an input bk=0 at this state, the state is maintained at state ST000, and an output is C0000. Also, when an input bk=1 at ST000, a transition to state ST001 is made. An output when a transition from state ST000 to state ST001 is made is C0001.

In addition, it is assumed that the initial state is state ST001. At this state, an input bk is always bk=1 due to a runlength limitation. When an input bk=1, a transition to state ST011 is made. When a transition from state ST001 to state ST011 is made, an output is C0011.

These state transitions and output values are as follows.
C1111: ST111→ST111
C1110: ST111→ST110, C0111: ST011→ST111
C0110: ST011→ST110
C1100: ST110→ST100, C0011: ST001→ST011
C1001: ST100→ST001
C1000: ST100→ST000, C0001: ST000→ST001
C0000: ST000→ST000

In Viterbi detection, various bit sequences can be associated with one another in a one-to-one relation via one of paths passing through the aforementioned states. Also, the Euclidean distance between a PR sequence to pass through the paths and an actual signal is obtained by sequentially summing transitions between the states constituting the paths, that is, the aforementioned branch metrics of branches.

Further, in order to select paths for minimizing the aforementioned Euclidean distance, the respective path metrics of two or less branches which are reached at each state are compared with each other in magnitude, and a path that has the lower path metric is sequentially selected. This selection information is transferred to a path memory register so that information in which a path to reach each state is expressed by a bit sequence is stored. The value in the path memory register is sequentially updated to be finally converged to a bit sequence for minimizing the Euclidean distance. This result is outputted. In the above manner, a bit sequence for generating a PR sequence having the shortest Euclidean distance to a reproduction signal can be retrieved (detected).

Figure 2:
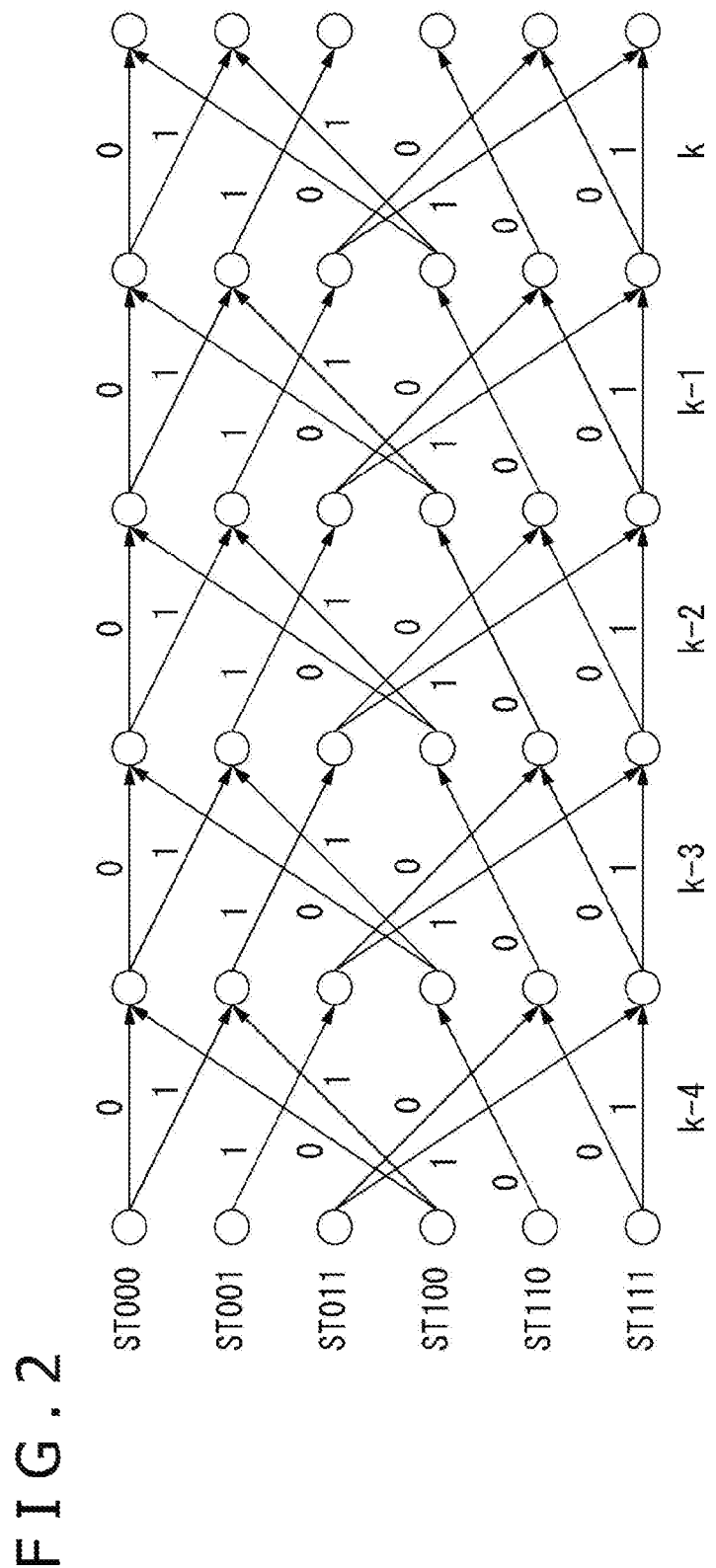
FIG. 2 is a trellis diagram in the case of PR(1,x,x,1).

FIG. 2 depicts a trellis diagram in the case of PR(1,x,x,1). As depicted in this trellis diagram, state transitions at respective time points (k, k-1, . . . ) are defined. That is, when a most likely path is discriminated, bits at each time point can be determined.

<2. Disc Drive Device>

In the present embodiment, an example in which a decoding device according to the present technology is applied to a disc drive device 1 for performing recording and reproduction of optical discs, will be explained.

As a technology for recording and reproducing digital data, there has been a data recording technology of using, as recording media, optical discs such as CDs (Compact Discs) and DVDs (Digital Versatile Discs). For example, the optical discs include a reproduction-only type such as a CD, a CD-ROM, or a DVD-ROM, in which information is recorded in the form of emboss pits, and a user-data recordable type such as a CD-R, a CD-RW, a DVD-R, a DVD-RW, a DVD+RW, or a DVD-RAM. In the recordable type, data can be recorded by use of a magnetooptical recording method, a phase-change recording method, a dye-film-change recording method, or the like. A dye-film-change recording method is also referred to as a write-once recording method for recording data only once such that the recorded data is unrewritable. Thus, this method is suitable to save data. On the other hand, in a magnetooptical recording method and a phase-change recording method, data is allowed to be rewritten. These methods are used for various applications including recording various content data such as music, videos, games, and application programs.

Moreover, high-density optical discs, which are called Blu-ray Discs (registered trademark, hereinafter referred to as "BD" in some cases), have been recently developed, so that a significant increase of the capacity is achieved.

The disc drive device 1 according to the present embodiment is capable of performing reproduction and recording with respect to reproduction-only discs and recordable discs (write once discs or rewritable discs) corresponding to BDs.

A BD, in the case of a recordable disc, is designed such that recording and reproduction of phase change marks and color change marks thereon are performed on condition that a combination of laser light (so-called blue laser) having a wavelength of 405 nm and an objective lens having an NA of 0.85 is provided. In the recordable disc, recording and reproduction are performed with a 64-KB (kilobytes) data block as a recording/reproduction unit (RUB: Recording Unit Block) while a track pitch is 0.32 μm and a line density is 0.12 μm/bit.

In addition, on a BD that is a ROM disc, reproduction-only data is recorded in the form of emboss pits each having a depth of approximately λ/4. Also in the ROM disc, a track pitch is 0.32 μm, a line density is 0.12 μm/bit, and a 64-KB data block is used as one reproduction unit (RUB).

In the case of BDs, a recordable capacity per single recording layer is approximately 25 GB (gigabytes), for example, due to the aforementioned condition of a track pitch and a line density.

The RUB, which is a recording/reproduction unit, is generated to have 498 frames in total which obtained by adding one-frame link areas before and after an ECC block (cluster) having 156 symbols×496 frames, for example.

It is to be noted that, in the case of a recordable disc, grooves are formed so as to wobble on the disc, and the wobbling grooves are used as recording/reproduction tracks. Wobbling of a groove is formed so as to include so-called ADIP (Address in Pregroove) data. That is, when wobbling information regarding the groove is detected, an address on the disc can be obtained.

In the case of a recordable disc, recording marks which are phase change marks are recorded on a track having the wobbling grooves. The phase change marks are recorded by an RLL(1,7) PP modulation method (RLL: Run Length Limited, PP: Parity preserve/Prohibit rmtr (repeated minimum transition runlength)) or the like.

When a channel clock period is "T," the mark length is 2 T to 8 T, for example.

In the case of a reproduction-only disc, no groove is formed, but data which is also modulated by an RLL(1,7) PP modulation method is recorded in the form of an emboss pit train.

Figure 3:
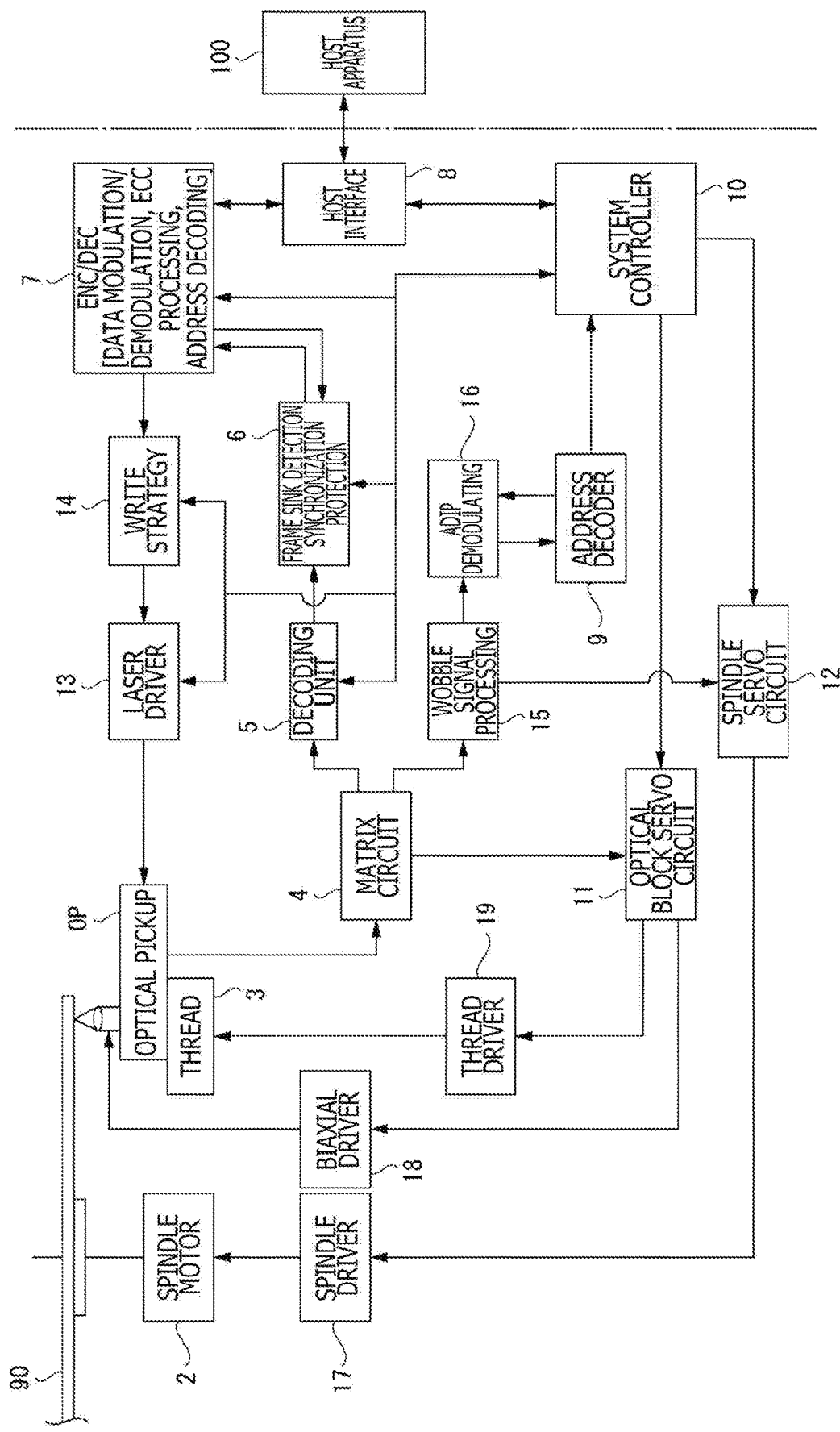
FIG. 3 is a block diagram of a disc drive device which is an embodiment according to the present technology.

FIG. 3 is a block diagram depicting an internal configuration example of the disc drive device 1.

For example, a disc 90 is a reproduction-only disc or a recordable disc of the aforementioned Blu-ray disc type. The disc drive device 1 according to the present embodiment is adapted to, as the disc 90, an ultra-high density disc having a recordable capacity of, for example, 80 GB or higher per recording layer under a BD physical condition (wavelength=approximately 405 nm, NA=approximately 0.85).

After loaded in the disc drive device 1, the disc 90 is put on a turn table (not depicted), and is rotationally driven at a constant linear velocity (CLV) by a spindle motor 2 during a recording/reproduction operation time.

During a reproduction time, information in marks (pits) recorded on a track on the disc 90 is read out by means of an optical pickup (optical head) OP.

In addition, in the case where the disc 90 is a recordable disc, user data is recorded, during a data recoding time, as a phase change mark or a color change mark on a track on the disc 90 by means of the optical pickup OP.

It is to be noted that, as reproduction-only management information, physical information, etc., regarding the disc is recorded on the disc 90 in the form of emboss pits or wobbling grooves. This information is also read out by means of the pickup OP. Furthermore, from the disc 90 that is a recordable type, ADIP information that is embedded as wobbling grooves in a track on the disc 90 is read out by means of the optical pickup OP.

A laser diode that serves as a laser light source, a photodetector for detecting reflection light, an objective lens that serves as an output end of laser light to the disc 90, an optical system for applying laser light to a disc recording surface via the objective lens and guiding the reflection light to the photodetector, and the like, are formed in the pickup OP. The laser diode outputs so-called blue laser light having a wavelength of 405 nm, for example. Further, the NA of the optical system is approximately 0.85.

In the pickup OP, the objective lens is held so as to be movable to a tracking direction and a focus direction by a biaxial mechanism.

The pickup OP is entirely movable to a disc radial direction by means of a thread mechanism 3.

The laser diode of the pickup OP is driven to emit laser light in response to a drive signal (drive current) from a laser driver 13.

Information regarding the reflection light from the disc 90 is detected by the photodetector, is converted to an electric signal that corresponds to the received light amount, and is supplied to a matrix circuit 4.

The matrix circuit 4 includes a current-voltage conversion circuit and a matrix computing/amplification circuit, etc., to correspond to output current from a plurality of light reception elements serving as photodetectors, and thereby generates necessary signals through matrix computation.

For example, an RF signal (reproduction data signal) corresponding to reproduction data, a focus error signal and a tracking error signal for servo control, and the like, are generated.

In addition, a push-pull signal is generated as a signal regarding wobbling of a groove, that is, a signal for detecting the wobbling.

A reproduction data signal (RF signal) outputted from the matrix circuit 4 is supplied to a decoding unit 5. A focus error signal and a tracking error signal outputted from the matrix circuit 4 are supplied to an optical block servo circuit 11. A push-pull signal outputted from the matrix circuit 4 is supplied to a wobble signal processing circuit 15.

The decoding unit 5 binarizes the RF signal, and supplies the resultant binary data stream (decoded value bi which will be described later) to a frame sink detection/synchronization protection circuit 6 which is disposed at a later stage.

Accordingly, at the decoding unit 5, the RF signal is subjected to A/D conversion, reproduction clock generation using a PLL (Phase Locked Loop), PR (Partial Response) equalization, and Viterbi decoding (maximum likelihood decoding). That is, a binary data stream is obtained through PRML decoding. The binary data stream obtained through the decoding is supplied to the frame sink detection/synchronization protection circuit 6.

At the frame sink detection/synchronization protection circuit 6, frame sink detection and synchronous protection for stably detecting a frame sink are performed on the binary data stream outputted from the decoding unit 5.

An encoding/decoding unit 7 performs demodulation of reproduction data during a reproduction time, and modulation of recorded data during a recording time. That is, data demodulation, deinterleaving, ECC decoding, address decoding, etc., are performed during a reproduction time. ECC encoding, interleaving, data modulation, etc., are performed during a recording time.

During reproduction, the binary data stream decoded by the decoding unit 5 and a demodulation timing signal based on the frame sink detection performed at the frame sink detection/synchronization protection circuit 6 are supplied to the encoding/decoding unit 7. The encoding/decoding unit 7 demodulates the binary data stream at a timing indicated by the demodulation timing signal based on the frame sink detection, so that reproduced data from the disc 90 is obtained. That is, demodulation of data recorded in the disc 90 through RLL(1,7) PP modulation, and ECC decoding for correcting errors are performed to obtain data reproduced from the disc 90.

The data decoded to reproduction data by the encoding/decoding unit 7 is transferred to a host interface 8, and is transferred to a host apparatus 100 on the basis of an instruction given by a system controller 10. The host apparatus 100 is a computer apparatus or an AV (Audio-Visual) system apparatus, for example.

In the case where the disc 90 is a recordable disc, ADIP information is processed during a recording/reproduction time.

That is, a push-pull signal which is outputted, from the matrix circuit 4, as a signal regarding wobbling of a groove is wobble data digitalized by the wobble signal processing circuit 15. In addition, a clock that is synchronized with the push-pull signal is generated through PLL processing.

The wobble data is subjected to MSK demodulation and STW demodulation at an ADIP demodulating circuit 16, is demodulated into a data stream forming an ADIP address, and is supplied to an address decoder 9.

The address decoder 9 decodes the supplied data, obtains an address value, and supplies the address value to the system controller 10.

During a recording time, data to be recorded is transferred from the host apparatus 100. The data to be recorded is supplied to the encoding/decoding unit 7 via the host interface 8.

In this case, the encoding/decoding unit 7 performs, as encoding processes for the data to be recorded, error correcting code addition (ECC encoding), interleaving, addition of a sub-code, etc. Further, the encoding/decoding unit 7 performs RLL(1-7) PP-modulation on the data having undergone these processes.

After being processed by the encoding/decoding unit 7, the data to be recorded is converted to a laser drive pulse in a state of having undergone, as recording compensation processes at a write strategy unit 14, fine adjustment of optimal recording power for the characteristics of a recording layer, a spot shape of laser light, a recording line speed, etc., and adjustment of a laser drive pulse waveform, and the like. The laser drive pulse is supplied to the laser driver 13.

The laser driver 13 gives the laser drive pulse having undergone a recording compensation process, to the laser diode of the pickup OP, and drives the laser diode to emit laser light. Thus, marks corresponding to the data to be recorded are formed on the disc 90.

It is to be noted that the laser driver 13 includes a so-called APC (Auto Power Control) circuit to perform control to make a laser output constant, irrespective of the temperature or the like, while monitoring the laser output power on the basis of an output from a laser-power monitoring detector included in the pickup OP. A target value of the laser output during a recording time and a reproduction time, are given by the system controller 10. During a recording time and a reproduction time, the laser output level is controlled to the target value.

The optical block servo circuit 11 generates, from focus error signals and tracking error signals from the matrix circuit 4, various servo drive signals including focus, tracking, and thread drive signals, so that a servo operation is executed.

That is, a focus drive signal and a tracking drive signal are generated according to a focus error signal and a tracking error signal, and a focus coil and a tracking coil of the biaxial mechanism in the pickup OP are driven by a biaxial driver 18. Accordingly, the pickup OP, the matrix circuit 4, the optical block servo circuit 11, the biaxial driver 18, and a tracking servo loop and a focus servo loop of the biaxial mechanism are formed.

Further, in accordance with a track jump command from the system controller 10, the optical block servo circuit 11 turns off the tracking servo loop and outputs a jump drive signal, and thereby causes execution of a track jump operation.

Moreover, the optical block servo circuit 11 generates a thread error signal which is obtained as a low-frequency component of the tracking error signal, and generates a thread drive signal on the basis of control of an access from the system controller 10, so that the thread mechanism 3 is driven by a thread driver 19. The thread mechanism 3 has a mechanism including a main shaft for holding the pickup OP, a thread motor, a transmission gear, etc. (which are not depicted), and drives the thread motor in accordance with the thread drive signal, so that a required sliding movement of the pickup OP is caused.

A spindle servo circuit 12 performs control to cause CLV (Constant Linear Velocity) rotation of the spindle motor 2.

The spindle servo circuit 12 obtains, as information regarding the current rotation speed of the spindle motor 2, a clock which is generated through PLL processing performed on a wobble signal, compares the obtained information with predetermined CLV reference speed information, and thereby generates a spindle error signal.

During a data reproduction time, a reproduction clock which is generated through PLL at the decoding unit 5 is information regarding the current rotation speed of the spindle motor 2. Thus, when this information is compared with the predetermined CLV reference speed information, a spindle error signal can be generated.

Further, the spindle servo circuit 12 outputs the spindle driving signal generated in accordance with the spindle error signal, and causes CLV rotation of the spindle motor 2 by means of a spindle driver 17.

Further, the spindle servo circuit 12 generates a spindle driving signal according to a spindle kick/brake control signal from the system controller 10, and executes an operation of starting, stopping, accelerating, or decelerating the spindle motor 2.

The various operations in the servo system and the recording/reproduction system described above are controlled by the system controller 10 which includes a microcomputer.

The system controller 10 executes various processes in accordance with commands given from the host apparatus 100 via the host interface 8.

For example, when a write command is outputted from the host apparatus 100, the system controller 10 first moves the pickup OP to an address where writing is to be performed. Then, the encoding/decoding unit 7 encodes data (e.g., video data or audio data) transferred from the host apparatus 100, as previously described. In accordance with the data thus encoded, the laser driver 13 performs driving to emit laser light, so that recording is performed.

For example, in the case where a read command to request for transfer of certain data recorded in the disc 90 is supplied from the host apparatus 100, the system controller 10 first controls a seek operation for an indicated address. That is, an instruction is given to the optical block servo circuit 11, and an access operation of the pickup OP to an address indicated by the seek command is executed.

Thereafter, operation control required to transfer data in the indicated data section to the host apparatus 100 is performed. That is, the data is read out from the disc 90, reproduction processes thereof are executed at the decoding unit 5, the frame sink detection/synchronization protection circuit 6, and the encoding/decoding unit 7, and the requested data is transferred.

It is to be noted that the disc drive device 1 connected to the host apparatus 100 has been explained with reference to the example in FIG. 3. However, the disc drive device 1 can adopt a form of not being connected to a separate apparatus. In this case, an operation unit and a display unit are provided. Thus, the configuration of the interface section for inputting/outputting data differs from that in FIG. 3. That is, it is sufficient that recording and reproduction are performed in accordance with a user's operation, and that a terminal portion for inputting/outputting various data is formed.

Needless to say, various other configuration examples can be adopted for the disc drive device 1. For example, a reproduction-only device may be used as the disc drive device 1.

<3. Configuration of Decoding Unit>

Figure 4:
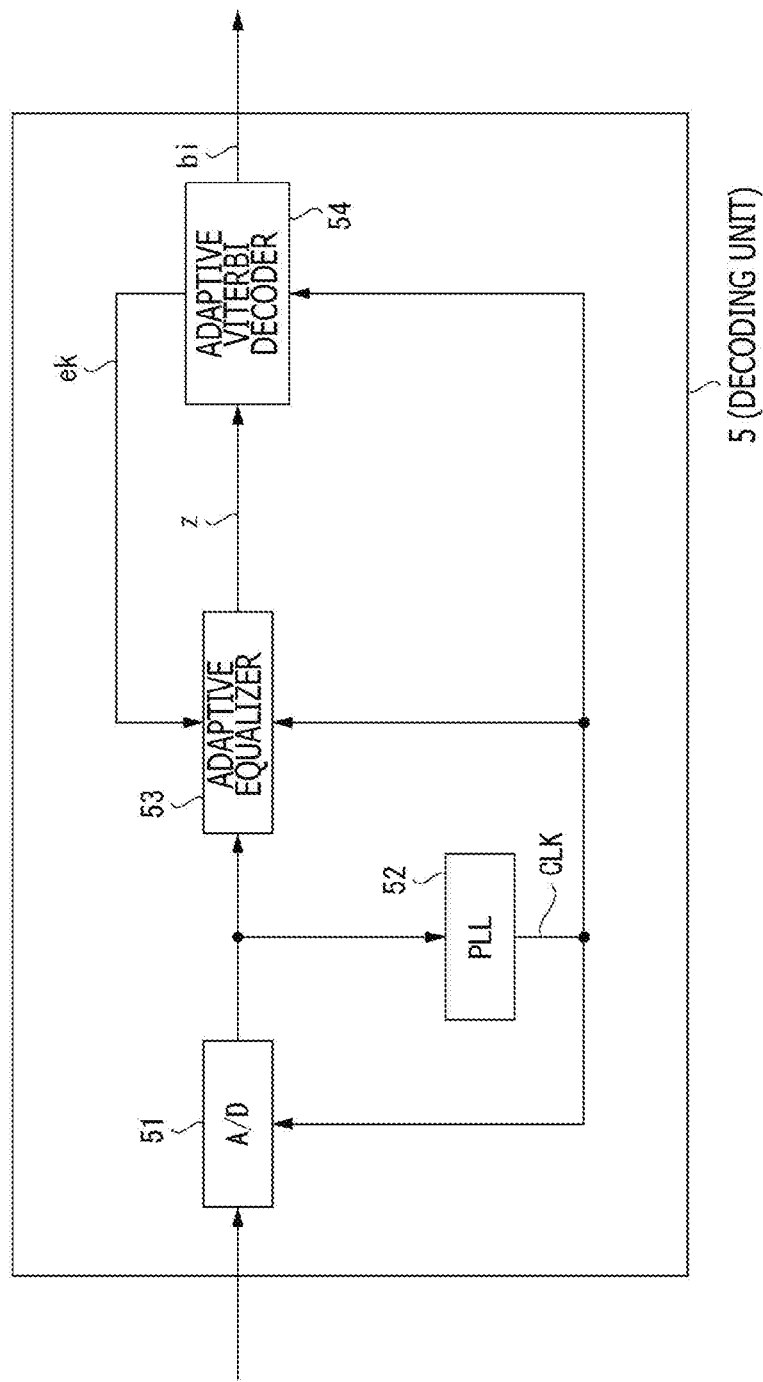
FIG. 4 is a block diagram of a decoding unit according to the embodiment.

FIG. 4 depicts a configuration example of the decoding unit 5. The decoding unit 5 includes an A/D converter 51, a PLL circuit 52, an adaptive equalizer 53, and an adaptive Viterbi decoder 54.

The A/D converter 51 converts an RF signal (reproduction data signal) supplied from the matrix circuit 4, into digital data.

The PLL circuit 52 generates a reproduction clock CLK through PLL processing in which, for example, an output from the A/D converter 51 is used, and supplies the generated reproduction clock CLK to the other units.

The RF signal converted to digital data is subjected to PR equalization at the adaptive equalizer 53. That is, equalization involving convolution of a PR coefficient is performed.

The RF signal having undergone the PR equalization at the adaptive equalizer 53 is inputted, as an equalized signal z, to the adaptive Viterbi decoder 54, is Viterbi-decoded, and is outputted as a decoded binary data stream (bit stream of a decoded value bi).

In the case of the present embodiment, the adaptive equalizer 53 has a function of causing a PR coefficient (frequency characteristic of PR equalization), which is used for PR equalization, to adaptively follow a frequency characteristic of an inputted RF signal.

Specifically, an equalization error signal ek which is generated by the adaptive Viterbi decoder 54 in a manner described later, is inputted to the adaptive equalizer 53, and the adaptive equalizer 53 updates a PR coefficient such that the equalization error signal ek is minimized. For this updating of a PR coefficient, an LMS (Least Squares Method) algorithm is used.

Moreover, the adaptive Viterbi decoder 54 of the present embodiment has a function of causing an identification point of maximum likelihood decoding, to adaptively follow a characteristic of an inputted signal, that is, a frequency characteristic or asymmetry of the equalized signal z. That is, the adaptive Viterbi decoder 54 has an adaptive Viterbi decoding function.

Figure 5:
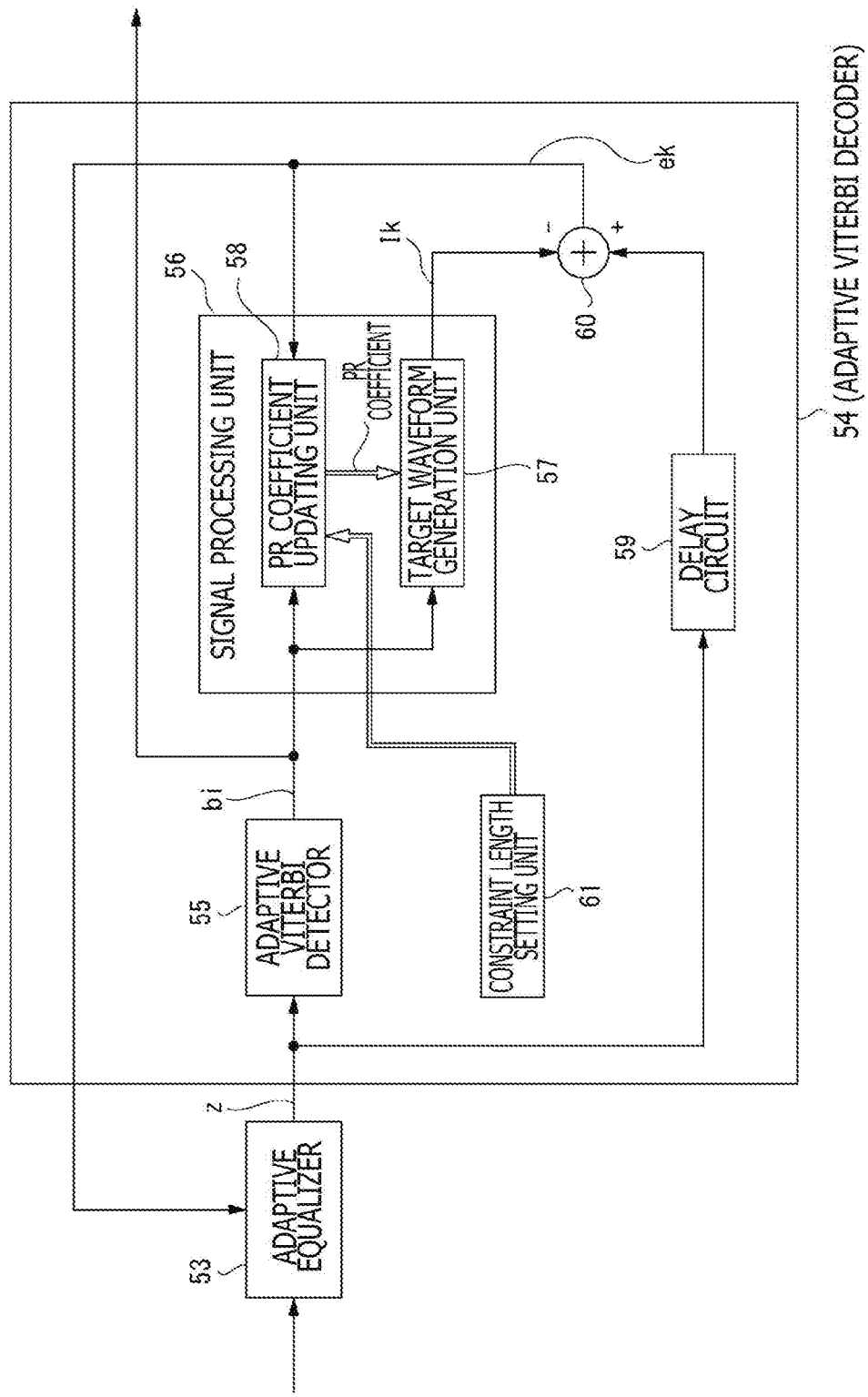
FIG. 5 is a diagram for explaining an internal configuration of an adaptive Viterbi decoder according to the embodiment.

FIG. 5 is a diagram for explaining an internal configuration of the adaptive Viterbi decoder 54, and also depicts the adaptive equalizer 53 depicted in FIG. 4 in addition to the internal configuration of the adaptive Viterbi decoder 54.

The adaptive Viterbi decoder 54 includes an adaptive Viterbi detector 55, a signal processing unit 56, a delay circuit 59, a subtractor 60, and a constraint length setting unit 61.

The adaptive Viterbi detector 55 has a configuration which will be explained later, and performs an adaptive Viterbi decoding process on the equalized signal z, and outputs a decoded value bi.

Figure 6:
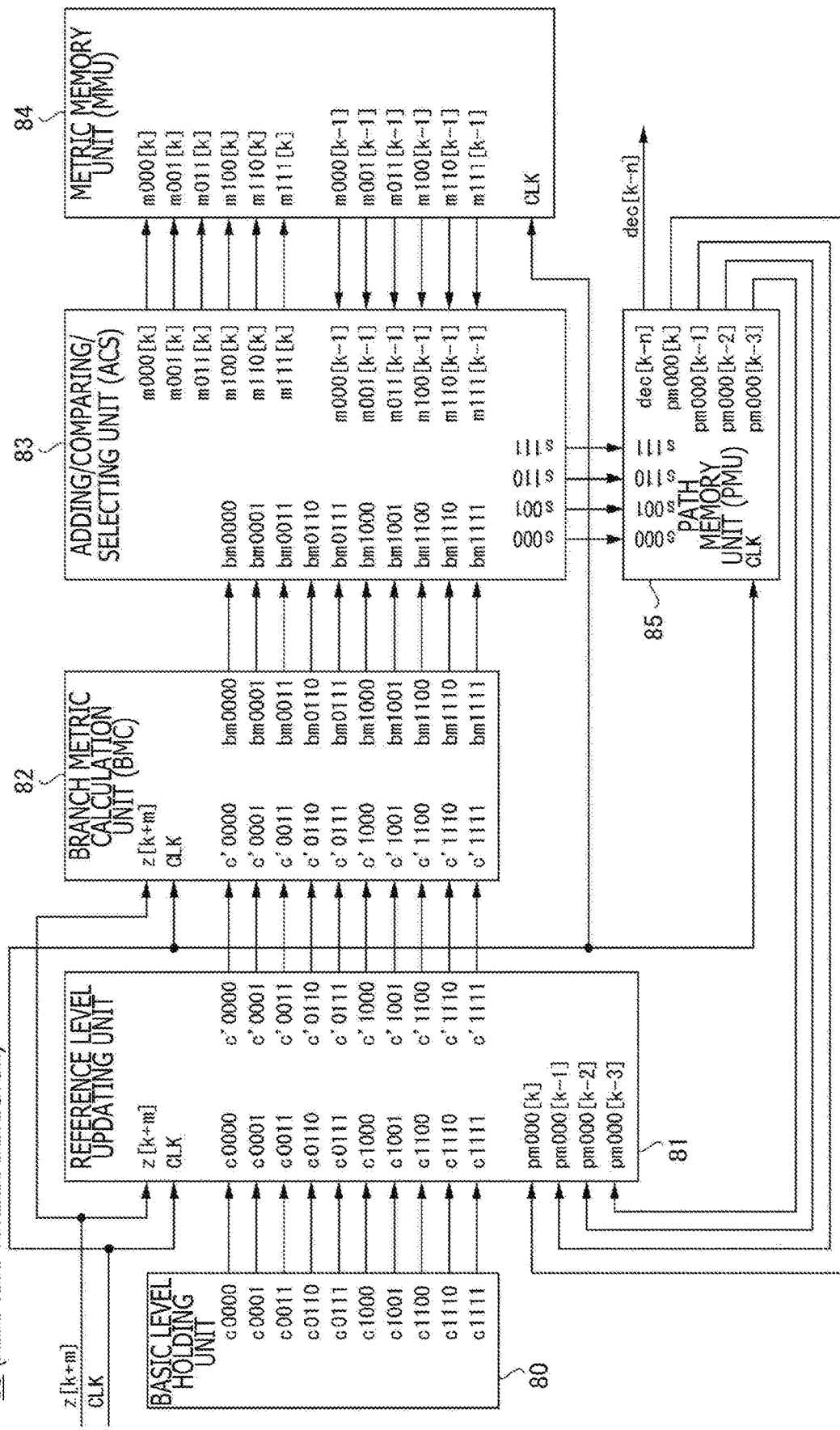
FIG. 6 is a block diagram of an adaptive Viterbi detector according to the embodiment.

FIG. 6 is a block diagram depicting an internal configuration example of the adaptive Viterbi detector 55.

The adaptive Viterbi detector 55 includes a reference level holding unit 80, a reference level updating unit 81, a branch metric calculation unit (BMC: Branch Metric Calculator) 82, an adding/comparing/selecting unit (ACS: Add Compare & Select) 83, a metric memory unit (MMU: Metric Memory Unit), and a path memory unit (PMU: Path Memory Unit) 85.

The reference level holding unit 80 holds initial values of amplitude reference levels c0000 to c1111 which are identification points.

The reference level updating unit 81 generates amplitude reference levels c'0000 to c'1111 obtained by adaptively updating the amplitude reference levels which are identification points, and gives the amplitude reference levels c'0000 to c'1111 to the branch metric calculation unit 82.

The branch metric calculation unit 82 obtains a branch metric bm by calculating a relative value of the Euclidean distance between an equalized signal z[k+m] and each of the amplitude reference levels c'0000 to c'1111. The branch metric bm over m clocks may be calculated. For example, when branch metrics of 10-value and 6-state Viterbi decoding are defined as bm0000 to bm1111, the branch metrics are as follows:

bm0000k=(Zk−c'0000)^2
bm0001k=(Zk−c'0001)^2
bm0011k=(Zk−c'0011)^2
bm0110k=(Zk−c'0110)^2
bm0111k=(Zk−c'0111)^2
bm1000k=(Zk−c'1000)^2
bm1001k=(Zk−c'1001)^2 bm1100k=(Zk−c'1100)^2
bm1110k=(Zk−c'1110)^2
bm1111k=(Zk−c'1111)^2
where "^" represents a power.

The adding/comparing/selecting unit 83 sums branch metrics along a path to reach six states, thereby generating path metrics m000[k] to m111[k].

The path metrics m000[k] to m111[k] are transmitted to the metric memory unit 84.

The metric memory unit 84 is a circuit for performing processing while preventing an overflow of the path metrics, and latches the path metrics m000[k] to m111[k] once, and transmits the latched path metrics m000[k-1] to m111[k-1] to the adding/comparing/selecting unit 83.

The adding/comparing/selecting unit 83 generates the path metrics m000[k] to m111[k] from the path metrics m000[k-1] to m111[k-1] and the branch metrics bm000 to bm111, as follows. It is to be noted that min{A,B} means a selection of a smaller one between A and B.

m000[k]=min{m000[k-1]+bm0000k, m100[k-1]+bm1000k}
m001[k]=min{m000[k-1]+bm0001k, m100[k-1]+bm1001k}
m011[k]=m001[k-1]+bm0011k
m100[k]=m110[k-1]+bm1100k
m110[k]=min{m111[k-1]+bm1110k, m011[k-1]+bm0110k}
m111[k]=min{m111[k-1]+bm1111k, m011[k-1]+bm0111k}

Next, the adding/comparing/selecting unit 83 creates, as information for selecting the minimum path metric, selection information sets s000, s001, s110, and s111 which are each expressed by a value of "0" or "1," and outputs the selection information sets s000, s001, s110, and s111 to the path memory unit 85.

The path memory unit 85 receives the selection information sets s000, s001, s110, and s111, stores an identification result which is the history of path metrics for each of the six states, sequentially updates the identification result, and outputs an identification result dec[k-n].

That is, the maximum likelihood path among paths such as those depicted in the trellis diagram in FIG. 2, is determined on the basis of the selection information sets s000 to s111, and, as a result of this, a value "0" or "1" which is the decoded value bi at a time point k-n is outputted.

Further, the path memory unit 85 outputs identification results pm000[k] to pm000[k-1] at respective time points to the reference level updating unit 81.

The reference level updating unit 81 generates amplitude reference levels c'0000 to c'1111 obtained by adaptively updating the amplitude reference levels c0000 to c1111 on the basis of a combination of the amplitude reference levels c0000 to c1111 and the identification results pm000[k] to pm000[k-1], and gives the amplitude reference levels c'0000 to c'1111 to the branch metric calculation unit 82.

For example, in the case where pm000[n]=0, pm000[n-1]=0, pm0000[n-2]=0, and pm000[n-3]=1, c0001 is updated to c'0001 as follows.

c'0001=α·z[k−n+2]+(1−α)·c0001 where α represents a correction coefficient.

Generally, updating a reference value cABCD (A, B, C, and D are each 0 or 1) to a reference value c'ABCD is as follows.

When uABCD is a logical expression of (pm000[n]=A)·(pm000[n-1]=B)·(pm0000[n-2]=C)·(pm000[n-3]=D), c'ABCD=α·(uABCD·z[k-n+2]+!uABCD·cABCD)+(1−α)·cABCD, where "!" indicates inversion of a logical value. If the logical value is FALSE(0), "!" is TRUE(1).

That is, in "c'ABCD=β·(uABCD·z[k-n+2]+!uABCD·cABCD)+(1−α)·cABCD,"

if uABCD=TRUE(1),
"c'ABCD=α·z[k-n+2]+(1-α)·cABCD," and
if uABCD=FALSE(0),
"c'ABCD=α·cABCD+(1-α)·cABCD=cABDC" (that is, updating is not performed).

The reference values are as follows:
c'0000=α·(u0000·z[k-n+2]+!u0000·c0000)+(1-α)·c0000
c'0001=α·(u0001·z[k-n+2]+!u0001·c0001)+(1-α)·c0001
c'0011=α·(u0011·z[k-n+2]+!u0011·c0011)+(1-α)·c0011
c'0110=α·(u0110·z[k-n+2]+!u0110·c0110)+(1-α)·c0110
c'0111=α·(u0111·z[k-n+2]+!u0111·c0111)+(1-α)·c0111
c'1000=α·(u1000·z[k-n+2]+!u1000·c1000)+(1-α)·c1000
c'1001=α·(u1001·z[k-n+2]+!u1001·c1001)+(1-α)·c1001
c'1100=α·(u1100·z[k-n+2]+!u1100·c1100)+(1-α)·c1100
c'1110=α·(u1110·z[k-n+2]+!u1110·c1110)+(1-α)·c1110
c'1111=α·(u1111·z[k-n+2]+!u1111·c1111)+(1-α)·c1111

The reference levels c'0000 to c'1111 thus updated are used by the branch metric calculation unit 82 to calculate the branch metrics bm, as described above.

As previously described, the adaptive Viterbi detector 55 causes the amplitude reference level to adaptively follow a frequency characteristic of the inputted equalized signal z.

The explanation is returned back to FIG. 5.

The decoded value bi obtained by adaptive Viterbi decoding at the adaptive Viterbi detector 55 is supplied to the signal processing unit 56.

The signal processing unit 56 includes a target waveform generation unit 57 and a PR coefficient updating unit 58. The target waveform generation unit 57 generates an equalization target waveform Ik of adaptive equalization at the adaptive equalizer 53, by convoluting a PR coefficient into the decoded value bi.

The PR coefficient updating unit 58 updates a PR coefficient which is used by the target waveform generation unit 57 to generate the equalization target waveform Ik. The updating of a PR coefficient is performed on the basis of the equalization error signal ek generated by the subtractor 60 (described later) and the decoded value bi inputted from the adaptive Viterbi detector 55, and through LSM computation for minimizing the correlation between the decoded value bi and the equalization error signal ek.

The equalization target waveform Ik generated by the target waveform generation unit 57 is inputted to the subtractor 60, and also, the equalized signal z from the adaptive equalizer 53 is inputted to the subtractor 60 via the delay circuit 59. The subtractor 60 outputs, as an equalization error signal ek, the difference between the inputted signals. It is to be noted that a delay time of the delay circuit 59 depends on a convolution time period at the target waveform generation unit 57.

As previously described, the equalization error signal ek is supplied to the adaptive equalizer 53, is used to update a PR coefficient (LMS computation) at the adaptive equalizer 53, and is also supplied to the PR coefficient updating unit 58.

The constraint length setting unit 61 sets the constraint length of a PR coefficient which is used by the target waveform generation unit 57 to generate the equalization target waveform Ik. It is to be noted that the constraint length setting unit 61 will be explained again later.

Figure 7:
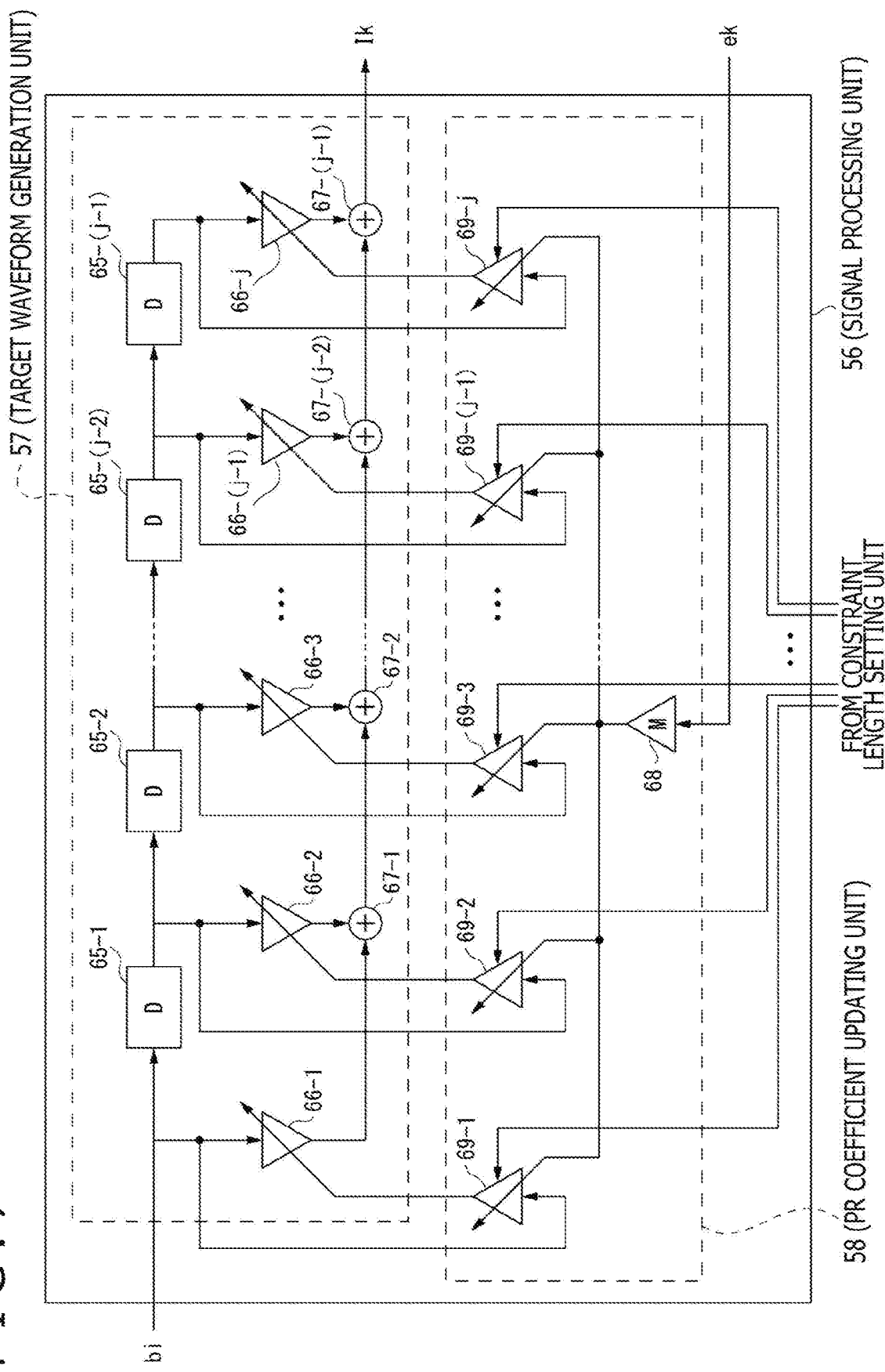
FIG. 7 is a block diagram of a signal processing unit including a target waveform generation unit and a PR coefficient updating unit according to the embodiment.

FIG. 7 is a block diagram depicting an internal configuration example of the signal processing unit 56.

In the signal processing unit 56, the target waveform generation unit 57 includes j ("j" is a natural number equal to or greater than 2) multipliers 66 (66-1 to 66-j) for which corresponding PR coefficients are respectively set, j-1 delayers 65 (65-1 to 65-(j-1)) that are inserted in series on an input line of the decoded value bi and that are for each delaying the decoded value bi by one clock and supplying the decoded value bi to the multipliers 66-1 to 66-j, respectively, and j-1 adders 67 (67-1 to 67-(j-1)) for calculating the sum of outputs from the multipliers 66.

Here, it may be sufficient that the numerical value "j" is set so as to correspond to the constraint length of PR to which adaptability is to be obtained. For example, when the constraint length=11, "j=11."

At the target waveform generation unit 57, j decoded values bi which are delayed by one clock each by the delayers 65-1 to 65-(j-1) are amplified by respective PR coefficients set for the corresponding multipliers 66 of the multipliers 66-1 to 66-j, the sum of the amplified values is calculated by the adders 67-1 to 67-(j-1), and the sum is outputted as the equalization target waveform Ik.

In the aforementioned manner, the target waveform generation unit 57 generates the equalization target waveform Ik by convoluting PR coefficients into the decoded values bi.

The PR coefficient updating unit 58 includes a multiplier 68 and j multipliers 69 (69-1 to 69-j).

The multiplier 68 multiplies the equalization error signal ek with an updating coefficient μ.

To each of the multipliers 69, the corresponding one of the decoded values bi delayed by the delayers 65-1 to 65-(j-1) is inputted. The output value, that is, "ek×μ" from the multiplier 68, is set as a multiplication coefficient for the multipliers 69-1 to 69-j. Accordingly, the multipliers 69-1 to 69-j multiply the corresponding decoded values bi with "ek×μ."

The output values from the multipliers 69-1 to 69-j are given as respective multiplication coefficients for the corresponding multipliers 66 (multiplier 66 having the same number at the end of the reference sign) of the multipliers 66-1 to 66-j in the target waveform generation unit 57. That is, PR coefficients to be used to generate the equalization target waveform Ik are respectively updated with use of the output values (ek×μ×bi) from the multipliers 69-1 to 69-j.

In the aforementioned manner, the product of the equalization error signal ek, the updating coefficient p, and the decoded value bi is fed back to a PR coefficient by the PR coefficient updating unit 58. With this configuration, updating PR coefficients is performed through LMS computation for minimizing the correlation between the decoded value bi and the equalization error signal ek.

Here, as understood from the above explanation, when updating PR coefficients, the PR coefficient updating unit 58 needs to acquire decoded values bi which are delayed by one clock each. The present embodiment adopts the configuration for acquiring the decoded values bi which are delayed by one clock each, that is, adopts the configuration in which the PR coefficient updating unit 58 and the target waveform generation unit 57 share the delayers 65-1 to 65-(j-1) in view of provision of the delayers 65-1 to 65-(j-1) in the target waveform generation unit 57.

A configuration in which the PR coefficient updating unit (hereinafter, denoted by reference sign "58'") does not share the delayers 65-1 to 65-(j-1) in the target waveform generation unit 57, is assumed. That is, the adaptive Viterbi decoder 54 (hereinafter, denoted by reference sign "54'") including the PR coefficient updating unit 58' having the delayers 65-1 to 65-(j-1) that are separated from the target waveform generation unit 57, is assumed.

Figure 8:
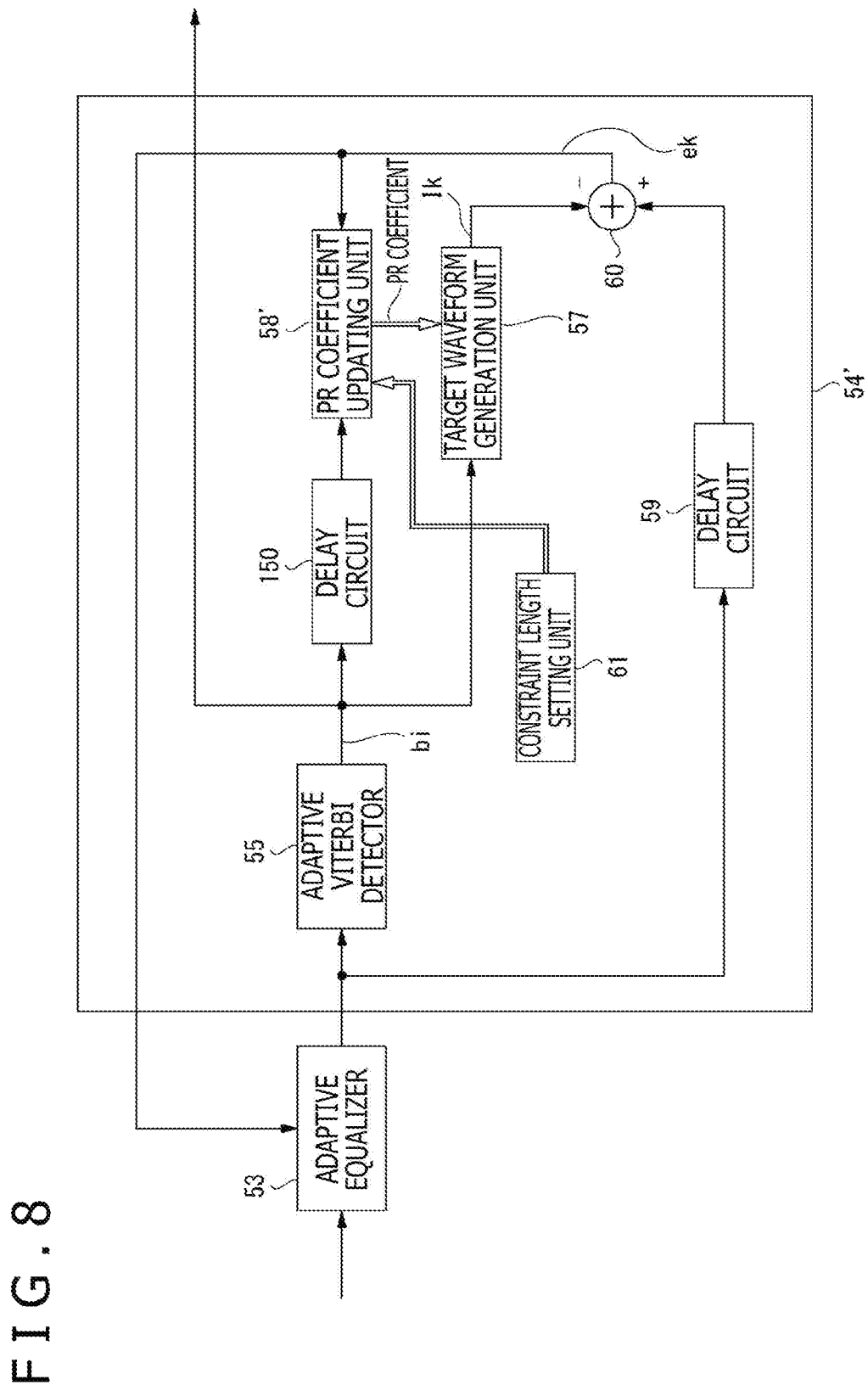
FIG. 8 is a diagram depicting a configuration example of an adaptive Viterbi decoder in a case where a delayer is not shared by a target waveform generation unit and a PR coefficient updating unit.

FIG. 8 illustrates the configuration of the adaptive Viterbi decoder 54'. In this case, a delay circuit 150 needs to be inserted between the PR coefficient updating unit 58' and the adaptive Viterbi detector 55. This is because the PR coefficient updating unit 58' needs to synchronize, with the equalization error signal ek, the decoded value bi to be inputted to the PR coefficient updating unit 58' in order to properly update a PR coefficient with use of the decoded value bi and the equalization error signal ek. That is, a delay corresponding to a convolution time period at the target waveform generation unit 57 needs to be given to the decoded value bi.

When the delayers 65-1 to 65-(j-1) are shared by the target waveform generation unit 57 and the PR coefficient updating unit 58, as depicted in FIG. 7, a need to provide the aforementioned delay circuit 150 is eliminated. Thus, the circuit configuration can be simplified. That is, simplification of the circuit configuration provided by sharing the delayers 65-1 to 65-(j-1), and simplification of the circuit configuration provided by eliminating the need to provide the delay circuit 150 can be achieved.

Also, in the present embodiment, the constraint length setting unit 61 depicted in FIG. 5 is allowed to set, in a variable manner, a constraint length for a PR coefficient which is used to generate the equalization target waveform Ik.

The constraint length setting unit 61 switches an enable/disable state of each multiplier 69 by using enable signals to the multipliers 69-1 to 69-j. An enabled multiplier 69 performs an operation of multiplying an input value (decoded value bi) with the multiplication coefficient (ek×μ), while a disabled multiplier 69 outputs "0" without performing the multiplying operation.

Accordingly, among the multipliers 66 in the target waveform generation unit 57, only a multiplier 66 for which a PR coefficient is updated by an enabled multiplier 69, is involved with convolution of PR coefficients. Therefore, for PR coefficients which are used to generate the equalization target waveform Ik, the constraint length of PR can be set in a variable manner.

With the aforementioned configuration, it is unnecessary to provide the target waveform generation unit 57 for each constraint length in order to become applicable to different constraint lengths of PR, that is, it is unnecessary to switch and use the target waveform generation unit 57 for each constraint length. Thus, the circuit configuration can be simplified.

It is to be noted that the constraint length setting unit 61 switches the enabled/disabled multipliers 69 in accordance with an instruction from, for example, the system controller 10 depicted in FIG. 3. In this case, the constraint length may be switched according to a recording format in the disc 90 such as the line density (line recording density) of the disc 90, for example.

Here, in the case where a PR coefficient is updated through LMS computation, there is a possibility that the PR coefficient is converged so as to reduce the amplitude of the equalized signal z. The equalized signal z having the reduced amplitude is different from a signal that would be primarily obtained, and is undesirable because deterioration in decoding performance is caused.

Figure 9:
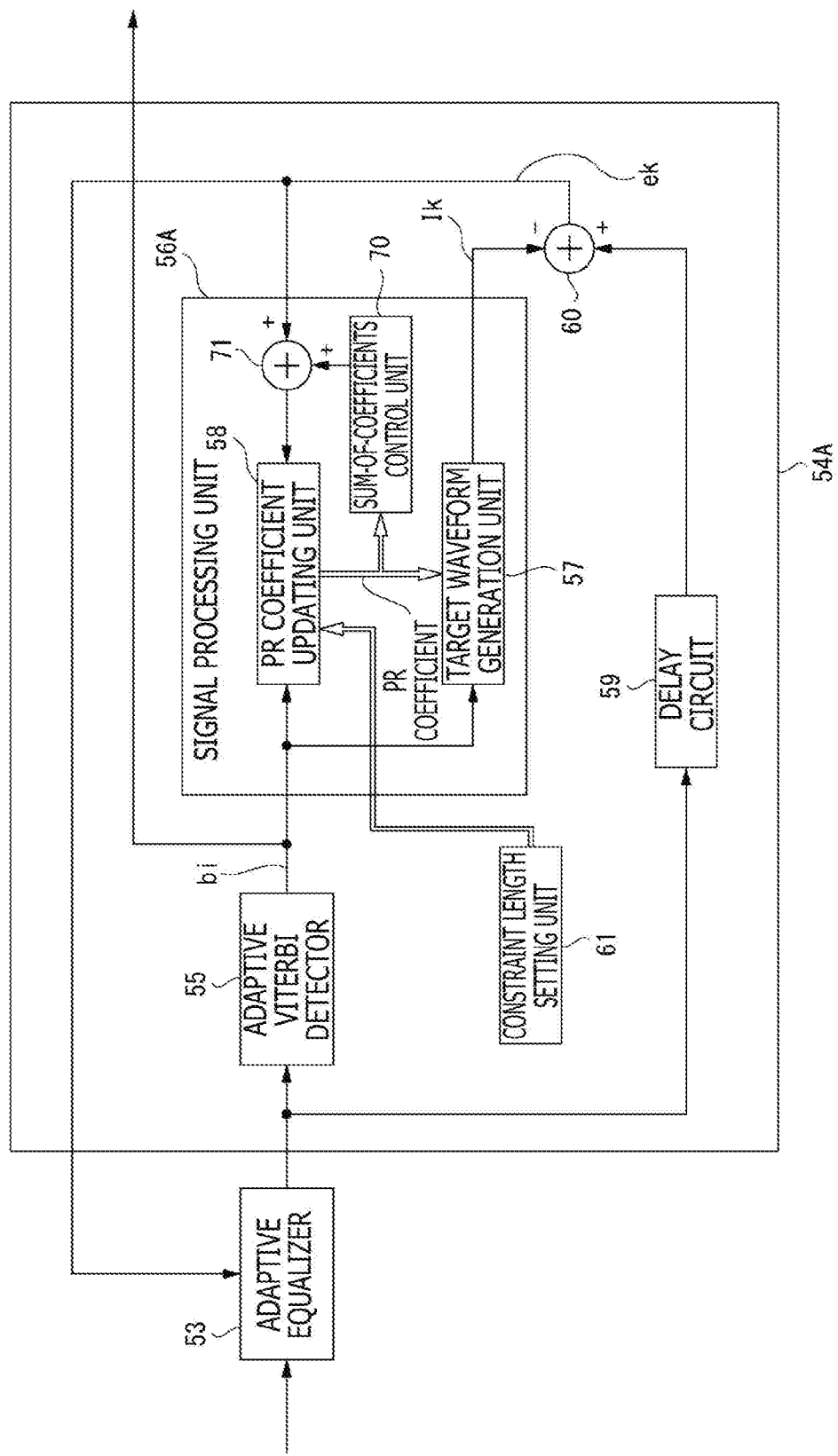
FIG. 9 is a diagram for explaining an internal configuration of an adaptive Viterbi decoder which is a first modification.

To this end, a configuration, such as an adaptive Viterbi decoder 54A of a first modification depicted in FIG. 9, for performing control such that the sum of PR coefficients falls within a fixed range, may be adopted.

It is to be noted that, in the following explanation, a component similar to that already explained above is denoted by the same reference sign, and an explanation thereof will be omitted.

In FIG. 9, the adaptive Viterbi decoder 54A has a difference in including a signal processing unit 56A in place of the signal processing unit 56. The signal processing unit 56A differs from the signal processing unit 56 in that a sum-of-coefficients control unit 70 and an adder 71 are provided in addition to the target waveform generation unit 57 and the PR coefficient updating unit 58. As depicted in the figure, the adder 71 is inserted between the subtractor 60 and the PR coefficient updating unit 58.

The sum-of-coefficients control unit 70 calculates the sum of PR coefficients which are used by the target waveform generation unit 57 to generate the equalization target waveform Ik, and controls the values of the PR coefficients such that the sum is kept within a fixed range. Specifically, the sum-of-coefficients control unit 70 of the present modification uses, as a "sum reference value," the initial value of the sum of PR coefficients, that is, the initial value "6" for PR(1, 2, 2, 1), for example, and performs control to increase the values of the PR coefficients when the calculated sum of PR coefficients is less than the sum reference value, and to decrease the values of the PR coefficients when the calculated sum of PR coefficients is greater than the sum reference value.

The sum-of-coefficients control unit 70 of the present modification performs control to adjust PR coefficients according to the result of the aforementioned comparison between the sum of PR coefficients and the sum reference value, by giving an offset to the equalization error signal ek. Specifically, the sum-of-coefficients control unit 70 calculates an offset value corresponding to the magnitude relation between the calculated sum of PR coefficients and the sum reference value and the magnitude of the difference therebetween, and outputs the offset value to the adder 71 to add the offset value to the error signal ek.

Accordingly, the values of the PR coefficients are adjusted according to the magnitude relation between the sum of PR coefficients and the sum reference value and the magnitude of the difference therebetween, so that the sum of PR coefficients are controlled to be kept within a fixed range.

It is to be noted that, in the case where the adaptive Viterbi decoder 54A is adaptable to a plurality of PR classes, a value corresponding to a set PR class is used as the sum reference value.

As a result of the aforementioned control for adjusting the sum of PR coefficients to be fixed, convergence of the PR coefficients to reduce the sum of PR coefficients (i.e., the amplitude of the equalized signal z) to 0 through the LMS computation can be prevented.

Consequently, PR coefficients can be properly updated, so that the decoding performance can be improved.

In addition, the sum-of-coefficients control unit 70 of the present modification controls the sum of PR coefficients within the fixed range, by giving an offset corresponding to the magnitude of the sum of PR coefficients to the equalization error signal ek inputted to the coefficient updating unit 58.

Accordingly, to perform the control for adjusting the sum of PR coefficients to be fixed, it is unnecessary to adopt a configuration of performing gain adjustment separately for the multipliers 66 (multipliers for convoluting a PR coefficient during generation of the equalization target waveform Ik).

Consequently, a circuit configuration for performing the control for adjusting the sum of PR coefficients to be fixed can be simplified.

Figure 10:
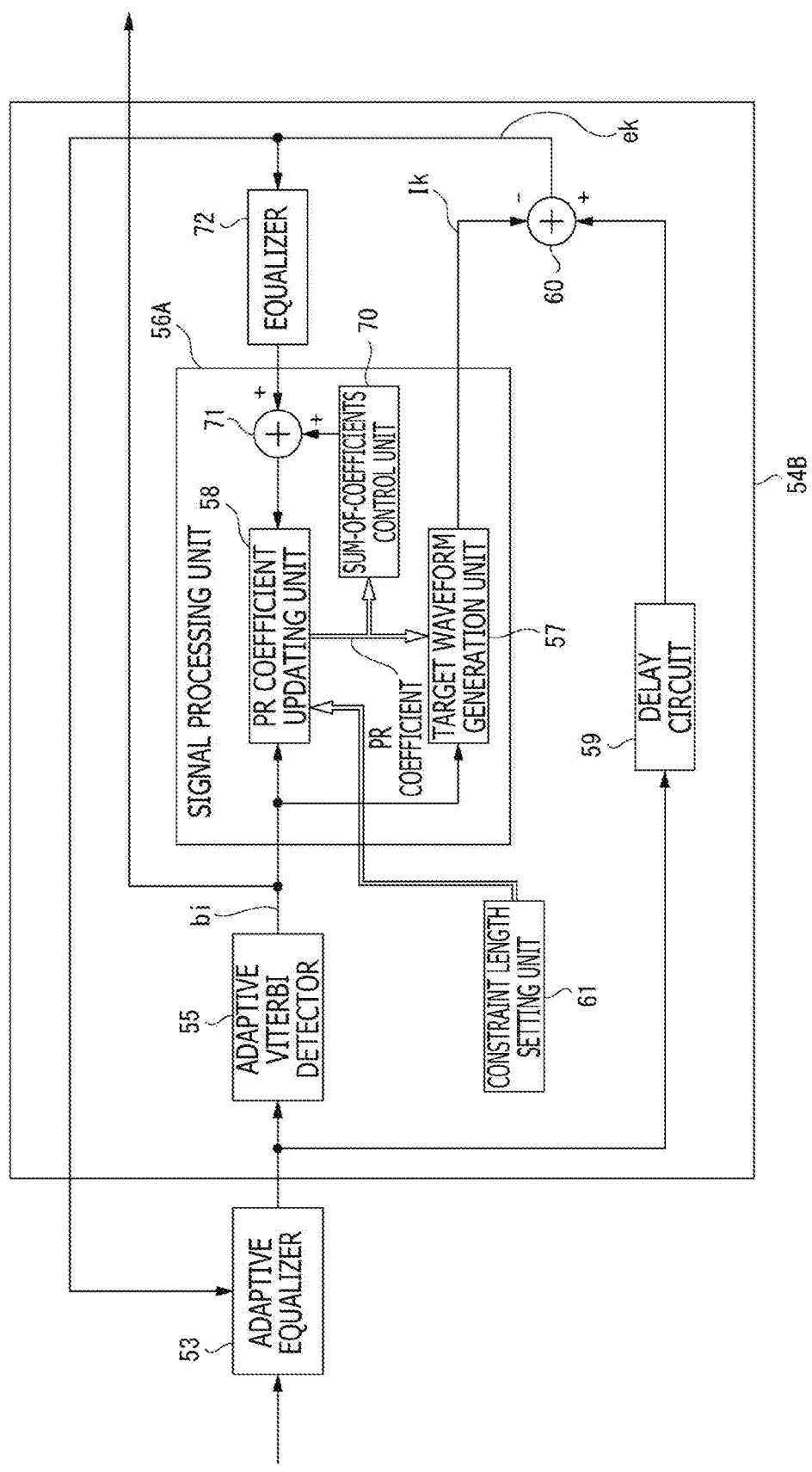
FIG. 10 is a diagram for explaining an internal configuration of an adaptive Viterbi decoder which is a second modification.

FIG. 10 is a diagram for explaining a configuration of an adaptive Viterbi decoder 54B which is a second modification.

The adaptive Viterbi decoder 54B of the second modification includes an equalizer 72 that equalizes the equalization error signal ek inputted to the coefficient updating unit 58. It is to be noted that the remaining components of the adaptive Viterbi decoder 54B are similar to those of the adaptive Viterbi decoder 54A of the first modification, and thus, an overlapping explanation thereof will be omitted.

As a result of insertion of the equalizer 72, a frequency characteristic of an equalization error signal which is used to update a PR coefficient can be adjusted, so that the convergence value of the PR coefficient can be adjusted.

In the present modification, the equalizer 72 is configured as a three-tap FIR (Finite Impulse Response) filter to boost a high frequency of the equalization error signal ek.

Figure 11:
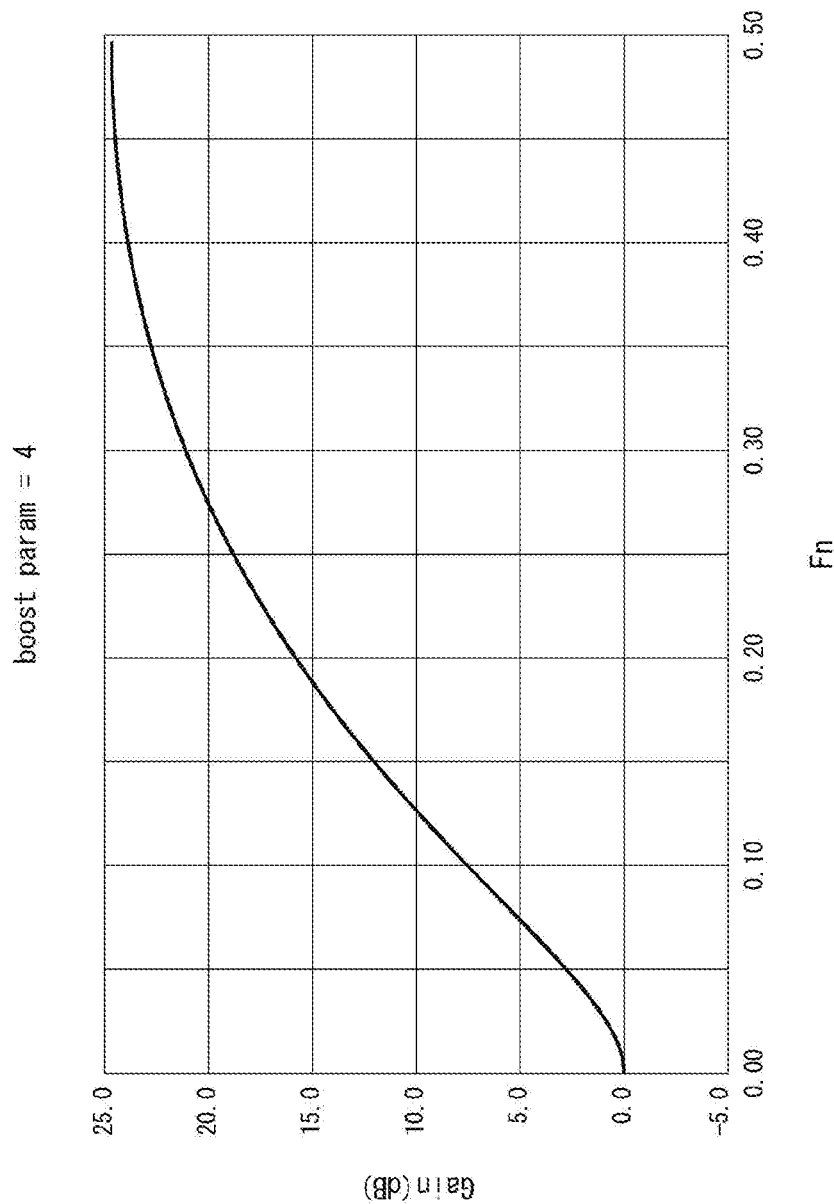
FIG. 11 is a diagram depicting an example of a frequency characteristic of an error signal equalization unit of the second modification.

In FIG. 11, a frequency characteristic in a case in which $k=4$ in coefficient $c[0]=-k$, $c[1]=1+2k$, $c[2]=-k$, is depicted for each of taps of the equalizer 72.

Figure 12:
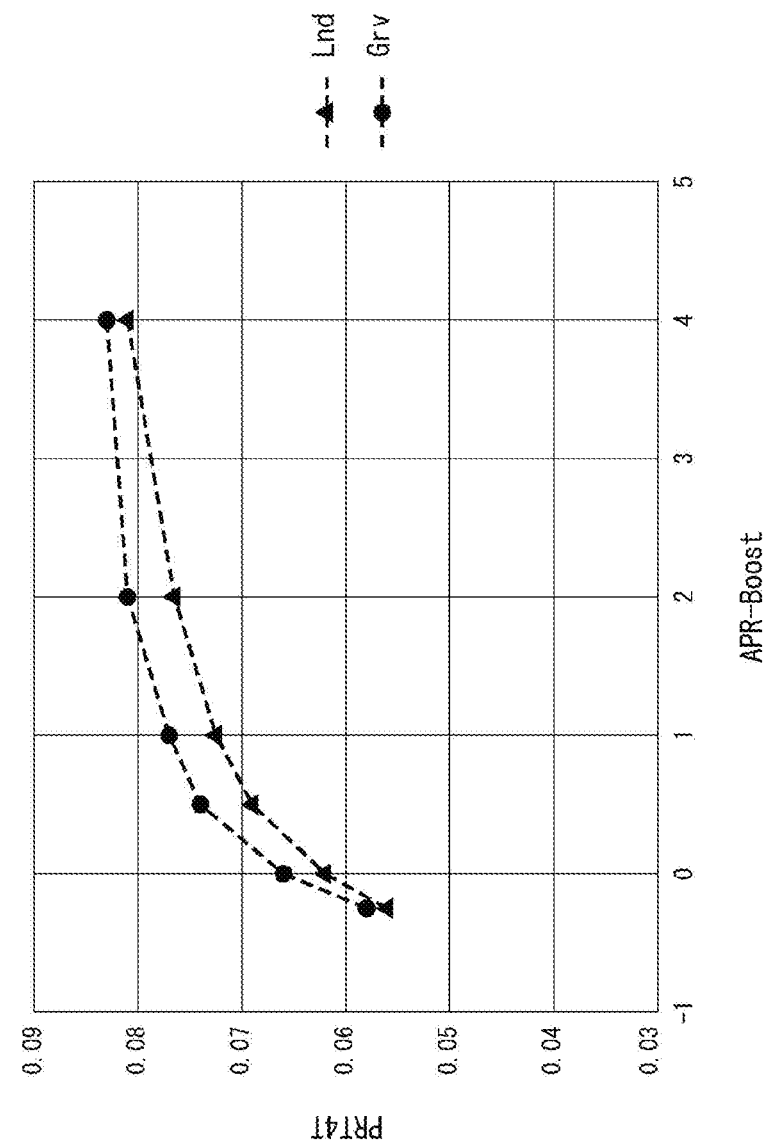
FIG. 12 is a diagram depicting a relation between a boost parameter and a 4T frequency gain of an error signal equalization unit of the second modification.

FIG. 12 is a diagram depicting a relation between a boost parameter (the value of k in a coefficient $c[x]$) of the equalizer 72 and a 4 T frequency gain. The horizontal axis represents the boost parameter, while the vertical axis represents the 4 T frequency gain.

In FIG. 12, the relation between the boost parameter k and the 4T frequency gain when a recording signal in a land of the disc 90 is reproduced, and that when a recording signal in a groove of the disc 90 is reproduced, are depicted (land=▲plots, groove=● plots). In view of these relations, it can be seen that, when the value of the boost parameter k is greater, convergence to a PR class with a greater high-frequency gain is generated.

Figure 13:
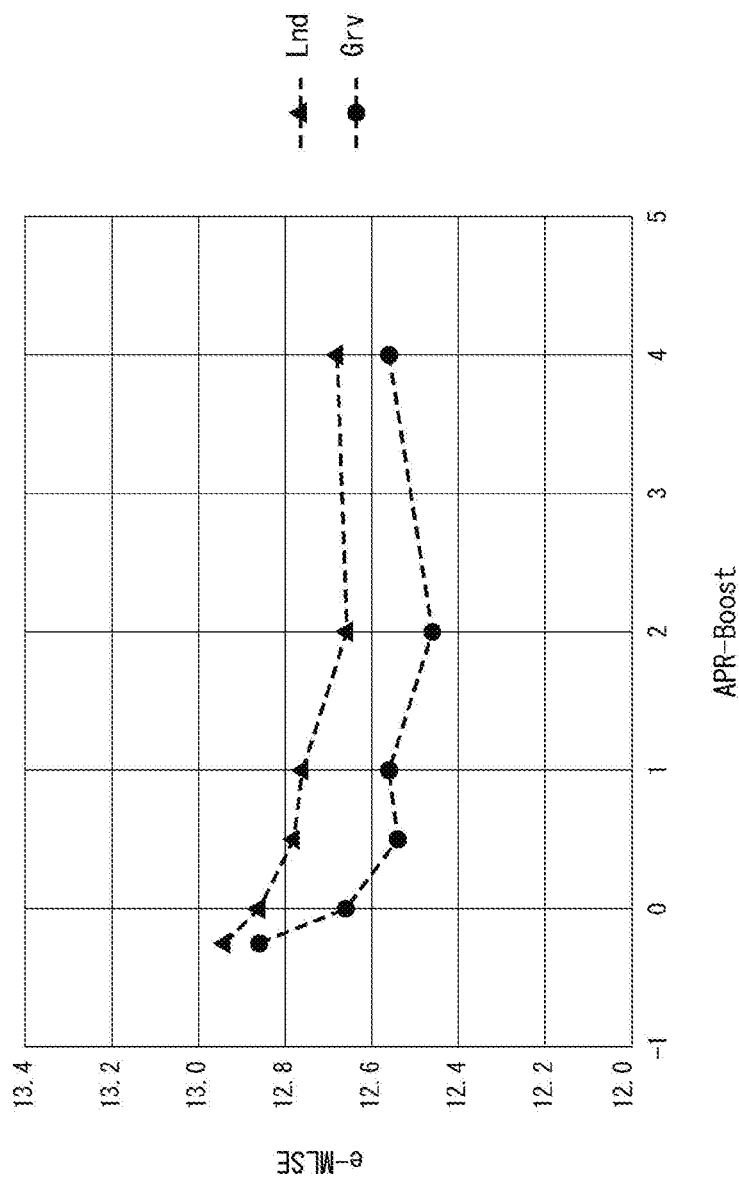
FIG. 13 is a diagram depicting a relation between a boost parameter and a signal quality evaluation value (e-MLSE) of the error signal equalization unit of the second modification.

FIG. 13 is a diagram depicting a relation between the boost parameter and a signal quality evaluation value e-MLSE. Also in this case, results each obtained when a recording signal in a land is reproduced are indicated by ▲ plots while results each obtained when a recording signal in a groove is reproduced are indicated by ● plots.

It is to be noted that "e-MLSE" is a value that is used as a signal quality evaluation index in Viterbi decoding, and is set as an evaluation value similar to a jitter which is used to evaluate a signal quality of a CD, etc. For the details of "e-MLSE," see the International Publication No. WO2013/183385," etc.

From FIG. 13, it can be seen that, when the boost parameter k is around 2, the value of e-MLSE becomes minimum (most excellent).

From FIGS. 12 and 13, it can be seen that, as a result of provision of the equalizer 72 for the equalization error signal ek, the convergence value of a PR coefficient can be adjusted.

Here, a PR coefficient for which the error has been minimized through LMS does not necessarily have the maximum decoding performance. As a result of adjustment of a frequency characteristic of the equalization error signal ek in the aforementioned manner, the convergence value of a PR coefficient can be finely adjusted, so that the PR coefficient can be made closer to an optimal value.

It is to be noted that a frequency characteristic of the equalizer 72 may be variable. Specifically, a parameter setting unit that sets, in a variable manner, the boost parameter k for the equalizer 72 in accordance with an instruction from the system controller 10, for example, may be provided.

Accordingly, the wider characteristics of input signals are handled, so that the decoding performance can be improved.

The results of various experiments regarding updating PR coefficients according to the embodiment will be explained with reference to FIGS. 14 to 16.

Figure 14:
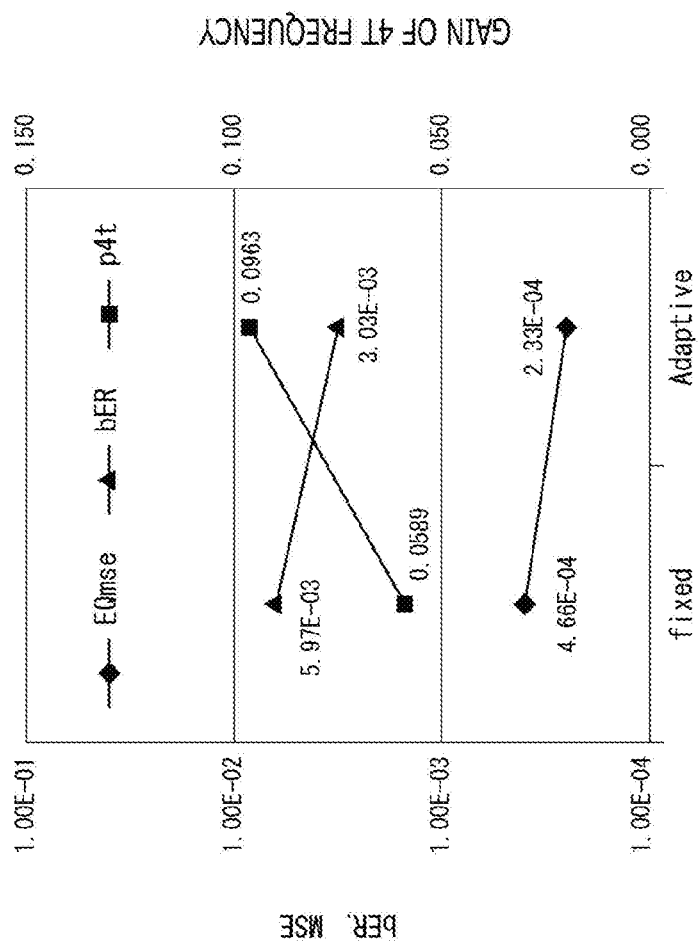
FIG. 14 is a diagram depicting an equalizer residual (MSE), an error rate (bER), and a 4T frequency gain in a case where PR coefficient updating according to the embodiment is performed and those in a case where the updating is not performed.

FIG. 14 depicts MSE (equalizer residual: ♦ plots), bER (error rate: ▲ plots), and a 4 T frequency gain (■ plots) in the case where PR coefficient updating according to the embodiment is performed ("Adaptive" in the figure) and those in the case where PR coefficient updating is not performed (that is, in the case where PR coefficients are fixed: "fixed" in the figure). It is to be noted that MSE is an evaluation value correlated to the error between the equalized signal z and an ideal waveform thereof.

Figure 15:
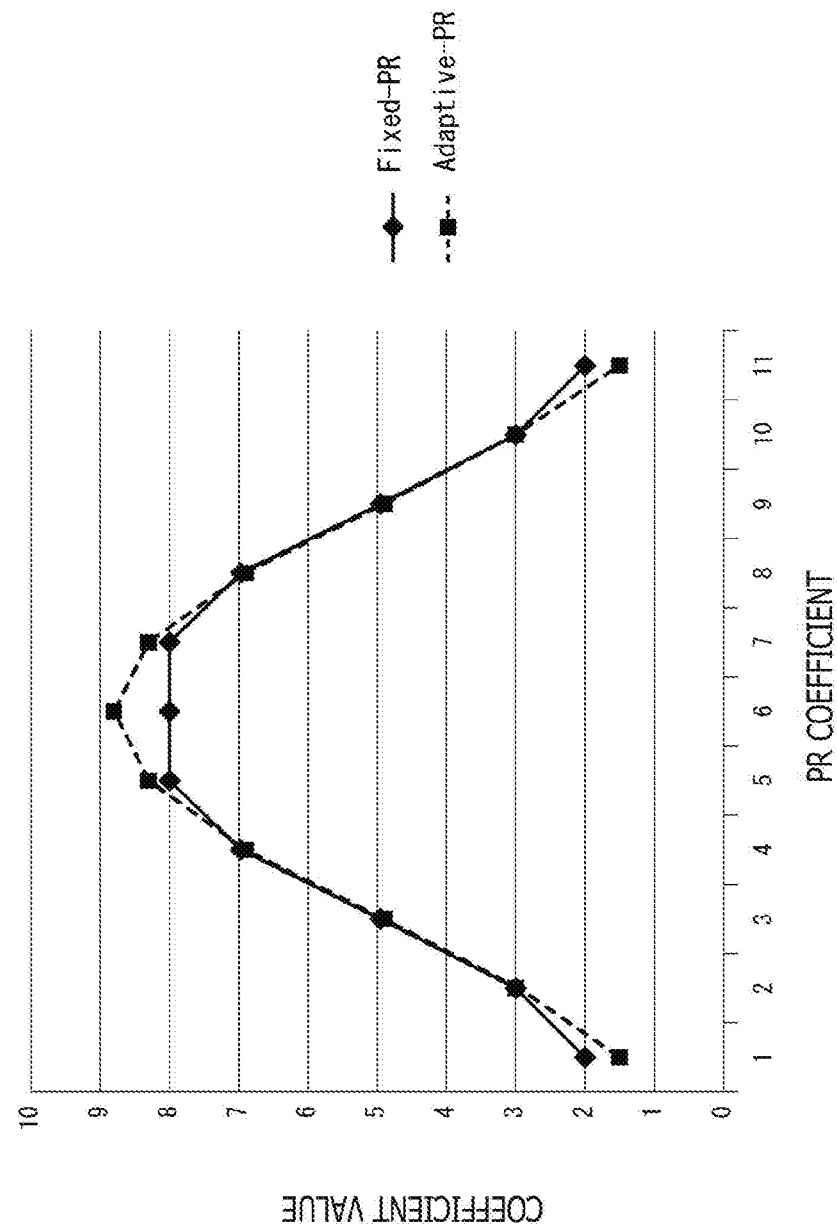
FIG. 15 is a diagram depicting PR coefficients in a case where the PR coefficients are fixed, and those in a case where PR coefficient updating according to the embodiment is performed.

Further, FIG. 15 depicts a comparison between PR coefficients (♦ plots) in the case where the PR coefficients are fixed, and PR coefficients (■ plots) converged though PR coefficient updating according to the embodiment. It is to be noted that, as seen from FIG. 15, 11 ISI (Inter-Symbol Interference: constraint length=11) was adopted as a PR class in the experiment.

Figure 16:
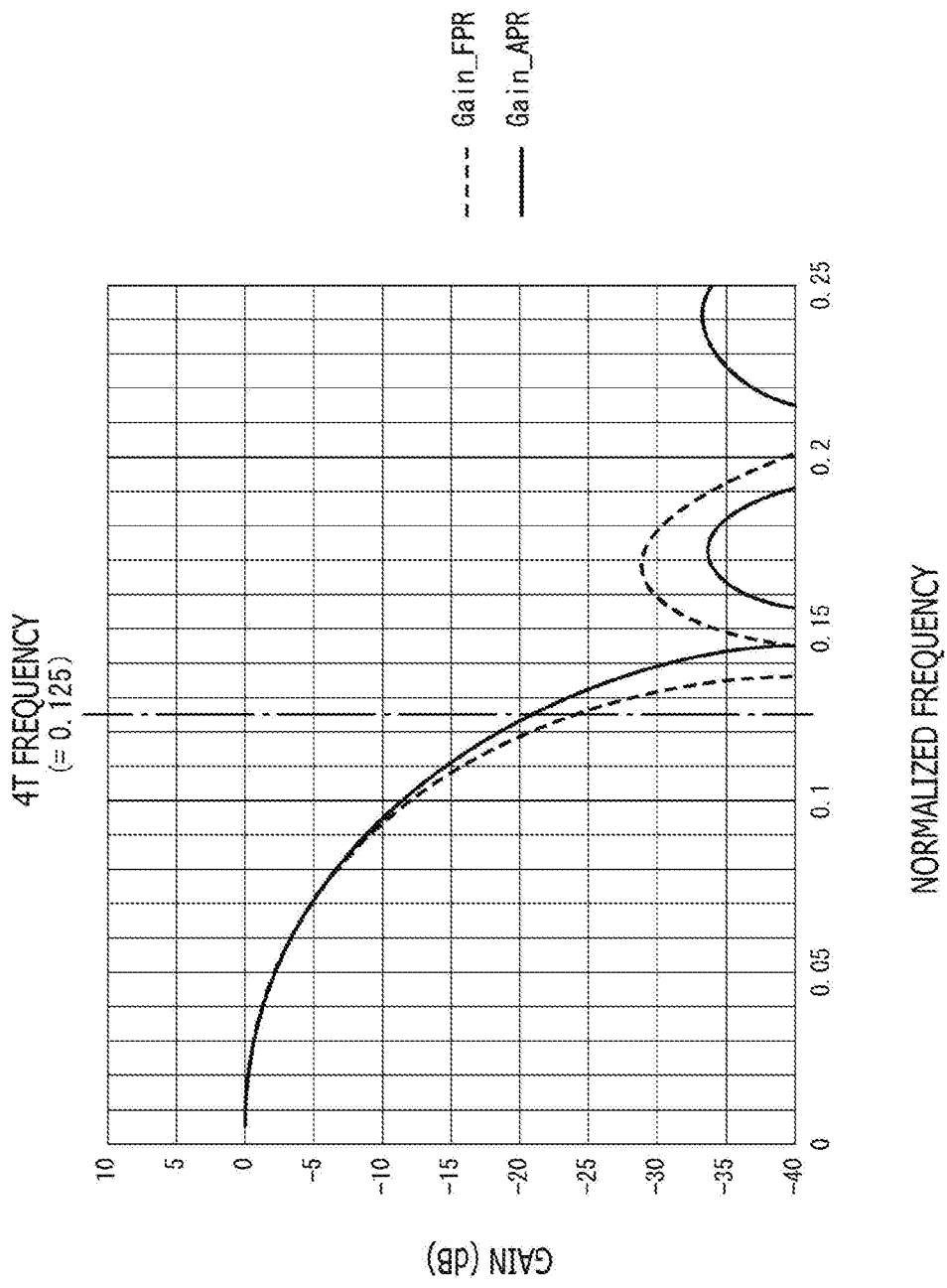
FIG. 16 is a diagram depicting frequency characteristics provided by PR coefficients in the case where the PR coefficients are fixed, and those in the case where PR coefficient updating according to the embodiment is performed.

FIG. 16 depicts, regarding a frequency characteristic by PR coefficients, a comparison between the frequency characteristic (dotted line) in the case where the PR coefficients are fixed, and the frequency characteristic (solid line) in the case where PR coefficient updating according to the embodiment is performed.

It is to be noted that, in the experiment, the adaptive Viterbi decoder 54B which has been explained as the second modification was used, the NA of the objective lens was set to 0.91, and the recording line density of the disc 90 was set to approximately 56 GB in terms of BD.

From FIG. 14, it can be seen that, according to the embodiment, MSE is small and error rate bER exhibits excellent values, compared to the case where PR coefficients are fixed.

In addition, with reference to FIG. 16 and the 4 T frequency gain in FIG. 14, it can be understood that, according to the embodiment, the frequency characteristic is shifted, with an increase of the 4 T frequency gain, to a characteristic with a greater high-frequency gain.

It is to be noted that, from FIG. 15, it can be confirmed that the sum of PR coefficients is approximately equal to that in the case where the PR coefficients are fixed.

According to these results, it can be understood that, even when the initial value of a PR coefficient is deviated from an optimal point for a reproduction condition such as the perturbation state of the optical pickup OP or the type of the optical disc 90, the embodiment adaptively updates the PR coefficient to be brought close to the optimal point. Accordingly, excellent decoding performance can be obtained.

<4. Conclusion of Embodiment>

As described so far, the decoding device (decoding unit 5) according to the embodiment includes:

an equalization unit that performs, on an input signal, partial response equalization involving convolution of a partial response coefficient, the equalization unit being an adaptive equalization unit (adaptive equalizer 53) that performs adaptive equalization to cause the partial response coefficient to adaptively follow a characteristic of the input signal; a maximum likelihood decoding unit that performs maximum likelihood decoding on an equalized signal, which is a resultant signal obtained by equalization of the input signal at the adaptive equalization unit, and outputs a decoded value, the maximum likelihood decoding unit being an adaptive maximum likelihood decoding unit (adaptive Viterbi detector 55) that causes an identification point of the maximum likelihood decoding to adaptively follow a characteristic of the input signal; a target waveform generation unit (target waveform generation unit 57) that, by convoluting the partial response coefficient into the decoded value, generates an equalization target waveform of the adaptive equalization which is performed by the adaptive equalization unit; an error signal generation unit (subtractor 60) that generates, as an equalization error signal, an error signal between the equalization target waveform and the equalized signal; and a coefficient updating unit (PR coefficient updating unit 58) that, through least-square-method computation for minimizing a correlation between the decoded value and the equalization error signal, updates the partial response coefficient which is used by the target waveform generation unit to generate the equalization target waveform.

Since the configuration using both adaptive equalization and adaptive maximum likelihood decoding is adopted, an equalization target that seems to be optimal for variation in characteristics of input signals is automatically set, so that stable decoding performance can be maintained.

In addition, since the configuration of feeding back the error signal between the equalized signal and the equalization target waveform to the adaptive equalization unit is adopted, any identification point of the adaptive maximum likelihood decoding unit does not need to be used during the adaptive equalization. Thus, this brings about an advantageous to an increase in constraint length.

Moreover, since, in the configuration using both adaptive equalization and adaptive maximum likelihood decoding, a PR coefficient which is used to generate the equalization target waveform is updated through least-square-method computation for minimizing the correlation between the decoded value and the equalization error signal, the PR coefficient is properly updated so as to be adapted to the characteristic of the input signal.

Consequently, according to the present embodiment, deterioration of convergence performance or operational stability due to an increase in constraint length can be suppressed when coefficients are updated, so that decoding performance can be improved.

Moreover, the decoding device according to the embodiment, further includes a sum-of-coefficients control unit (sum-of-coefficients control unit 70) that calculates a sum of partial response coefficients which are used to generate the equalization target waveform, and controls an updating operation at the coefficient updating unit such that the sum falls within a fixed range.

Accordingly, convergence of a PR coefficient so as to reduce the sum of PR coefficients (i.e., the amplitude of an equalized signal) to 0 through least-square-method computation, is prevented.

Consequently, PR coefficients can be properly updated, so that the decoding performance can be improved.

Moreover, in the decoding device according to the embodiment, the sum-of-coefficients control unit performs control to adjust the sum within the fixed range by giving an offset corresponding to a magnitude of the sum to the equalization error signal inputted to the coefficient updating unit.

Accordingly, it is unnecessary to adopt a configuration for, when performing control to keep the sum of PR coefficients within the fixed range, performing gain adjustment separately for the multipliers that are for convoluting PR coefficients during generation of the equalization target waveform.

Consequently, the circuit configuration for performing control to keep the sum of PR coefficients within the fixed range can be simplified.

Furthermore, the decoding device according to the embodiment further includes an error signal equalization unit (equalizer 72) that performs equalization on the equalization error signal inputted to the coefficient updating unit.

Accordingly, a frequency characteristic of the equalization error signal which is used to update a PR coefficient can be adjusted, so that the convergence value of the PR coefficient can be adjusted.

Consequently, adjustment can be made so as to converge a PR coefficient to a more appropriate value that corresponds to an actual characteristic of an input signal, so that decoding performance can be improved.

In addition, in the decoding device according to the embodiment, the error signal equalization unit amplifies a high-frequency component of the equalization error signal.

Accordingly, the value of a PR coefficient is converged such that an equalization characteristic with a greater high-frequency gain is obtained as an equalization characteristic of the adaptive equalization unit, so that decoding performance can be improved.

In high-density optical discs, a high-frequency component of a read-out signal is likely to be attenuated due to the influence of the diffraction limit. That is, the signal enters a state as if an LPF (Low Pass Filter) is applied to a read-out signal that would be obtained. In order to improve the decoding performance of PRML decoding, a frequency characteristic in PR equalization should be set according to the aforementioned frequency characteristic of optical discs. That is, a cut-off frequency of PR equalization ideally matches a cut-off frequency of an optical disc read-out signal as described above.

As a result of the aforementioned high-frequency boosting performed by the error signal equalization unit, these cut-off frequencies can be caused to match each other, so that decoding performance can be improved.

Furthermore, in the decoding device according to the embodiment, delayers (delayers 65-1 to 65-(j-1)) each for delaying a decoded value by one clock are shared by the coefficient updating unit and the target waveform generation unit.

Accordingly, when the configuration for updating a PR coefficient through least-square-method computation for minimizing the correlation between a decoded value and an equalization error signal is implemented, the circuit configuration can be simplified.

Here, if the delayers are not shared by the target waveform generation unit and the coefficient updating unit, a decoded value to be inputted to the coefficient updating unit needs to be delayed by a time period required for the target waveform generation unit to generate the equalization target waveform. As a result, delay means needs to be provided between the adaptive maximum likelihood decoding unit and the coefficient updating unit.

With the above configuration, the circuit configuration can be simplified because the delayers are shared by the target waveform generation unit and the coefficient updating unit, and the circuit configuration is simplified because it is unnecessary to delay an input of a decoded value to the coefficient updating unit, as explained above. Further, occurrence of a needless process delay can be prevented.

Moreover, in the decoding device according to the embodiment, the coefficient updating unit is configured such that the number of partial response coefficients to be updated by the coefficient updating unit is changeable.

Accordingly, a PR coefficient can be updated according to various constraint lengths.

Consequently, the decoding device capable of performing decoding adaptably to more various characteristics of an input signal can be implemented.

Furthermore, in the decoding device according to the embodiment, the coefficient updating unit changes the number of partial response coefficients to be updated, by controlling actuation/stop of a multiplier which is used to update a partial response coefficient.

Accordingly, it is unnecessary to adopt a configuration in which a coefficient updating circuit for updating a PR coefficient is provided for each constraint length which is desired to be handled. To become adaptable to a plurality of PR classes of which constraint lengths are different, it is sufficient to provide a single coefficient updating circuit.

Consequently, the circuit configuration can be simplified.

Moreover, a decoding method according to the embodiment includes: an equalization step of performing, on an input signal, partial response equalization involving convolution of a partial response coefficient, the equalization step being an adaptive equalization step of performing adaptive equalization to cause the partial response coefficient to adaptively follow a characteristic of the input signal; and a maximum likelihood decoding step of performing maximum likelihood decoding on an equalized signal, which is a resultant signal obtained by equalization of the input signal in the adaptive equalization step, and of outputting a decoded value, the maximum likelihood decoding step being an adaptive maximum likelihood decoding step of causing an identification point of the maximum likelihood decoding to adaptively follow a characteristic of the input signal. The decoding method further includes: a target waveform generation step of, by convoluting the partial response coefficient into the decoded value, generating an equalization target waveform of the adaptive equalization which is performed in the adaptive equalization step; an error signal generation step of generating, as an equalization error signal, an error signal between the equalization target waveform and the equalized signal; and a coefficient updating step of, through least-square-method computation for minimizing a correlation between the decoded value and the equalization error signal, updating the partial response coefficient which is used to generate the equalization target waveform in the target waveform generation step.

Also by this decoding method, functions and effects similar to those provided by the decoding device according to the aforementioned embodiment can be obtained.

It is to be noted that the effects described in the present description are just examples, and thus, are not limited. In addition, another effect may be provided.

The examples in which the present technology is applied to a decoding system for signals read out from optical recording medium, have been explained so far. However, the present technology is applicable to decoding systems excluding a decoding system for signals read out from optical recording medium, and thus, is applicable to, for example, a decoding system for received signals in wireless communication.

<5. Present Technology>

It is to be noted that the present technology may have the following configurations.

(1) A decoding device including:

an equalization unit that performs, on an input signal, partial response equalization involving convolution of a partial response coefficient, the equalization unit being an adaptive equalization unit that performs adaptive equalization to cause the partial response coefficient to adaptively follow a characteristic of the input signal;

a maximum likelihood decoding unit that performs maximum likelihood decoding on an equalized signal, which is a resultant signal obtained by equalization of the input signal at the adaptive equalization unit, and outputs a decoded value, the maximum likelihood decoding unit being an adaptive maximum likelihood decoding unit that causes an identification point of the maximum likelihood decoding to adaptively follow a characteristic of the input signal;

a target waveform generation unit that, by convoluting the partial response coefficient into the decoded value, generates an equalization target waveform of the adaptive equalization which is performed by the adaptive equalization unit;

an error signal generation unit that generates, as an equalization error signal, an error signal between the equalization target waveform and the equalized signal; and a coefficient updating unit that, through least-square-method computation for minimizing a correlation between the decoded value and the equalization error signal, updates the partial response coefficient which is used by the target waveform generation unit to generate the equalization target waveform.

(2) The decoding device according to (1), further including:

a sum-of-coefficients control unit that calculates a sum of partial response coefficients which are used to generate the equalization target waveform, and controls an updating operation at the coefficient updating unit such that the sum falls within a fixed range.

(3) The decoding device according to (1) or (2), in which the sum-of-coefficients control unit performs control to adjust the sum within the fixed range by giving an offset corresponding to a magnitude of the sum to the equalization error signal inputted to the coefficient updating unit.

(4) The decoding device according to any one of (1) to (3), further including:

an error signal equalization unit that performs equalization on the equalization error signal inputted to the coefficient updating unit.

(5) The decoding device according to (4), in which the error signal equalization unit amplifies a high-frequency component of the equalization error signal.

(6) The decoding device according to any one of (1) to (5), in which a delayer for delaying the decoded value by one clock is shared by the coefficient updating unit and the target waveform generation unit.

(7) The decoding device according to any one of (1) to (6), in which the coefficient updating unit is configured such that the number of partial response coefficients to be updated by the coefficient updating unit is changeable.

(8) The decoding device according to (7), in which the coefficient updating unit changes the number of partial response coefficients to be updated, by controlling actuation/stop of a multiplier which is used to update a partial response coefficient.

REFERENCE SIGNS LIST

1 Disc drive device
OP Optical pickup
5 Decoding unit
53 Adaptive equalizer
54, 54A, 56B Adaptive Viterbi decoder
55 Adaptive Viterbi detector
56, 56A Signal processing unit
57 Target waveform generation unit
58 PR coefficient updating unit
59 Delay circuit
60 Subtractor
61 Constraint length setting unit
65-1 to 65-(j-1) Delayer 66-1 to 66-*j* Multiplier
67-1 to 67-(j-1) Adder
68 Multiplier
69-1 to 69-*j* Multiplier
70 Sum-of-coefficients control unit
71 Equalizer

The invention claimed is:
1. A decoding device, comprising:
an equalization unit configured to:
perform, on an input signal, partial response equalization that involves convolution of a partial response coefficient of a plurality of partial response coefficients, wherein
the equalization unit is an adaptive equalization unit, and
the partial response equalization is adaptive equalization that causes the partial response coefficient to adaptively follow a characteristic of the input signal; and
obtain an equalized signal based on the partial response equalization of the input signal;
a maximum likelihood decoding unit configured to perform maximum likelihood decoding on the equalized signal, and output a decoded value, wherein
the maximum likelihood decoding unit is an adaptive maximum likelihood decoding unit that causes an identification point of the maximum likelihood decoding to adaptively follow the characteristic of the input signal;
a target waveform generation unit configured to generate, by convolution of the partial response coefficient into the decoded value, an equalization target waveform of the adaptive equalization;
an error signal generation unit configured to generate, as an equalization error signal, an error signal between the equalization target waveform and the equalized signal;
a coefficient updating unit configured to update, through least-square-method computation for minimization of a correlation between the decoded value and the equalization error signal, the partial response coefficient;
a sum-of-coefficients control unit configured to:
calculate a sum of the plurality of partial response coefficients which are used to generate the equalization target waveform; and
control an updating operation at the coefficient updating unit such that the calculated sum falls within a fixed range.
2. The decoding device according to claim 1, wherein the sum-of-coefficients control unit is further configured to control the updating operation to adjust the sum within the fixed range based on an offset corresponding to a magnitude of the sum to the equalization error signal.
3. The decoding device according to claim 1, further comprising an error signal equalization unit configured to perform equalization on the equalization error signal inputted to the coefficient updating unit.
4. The decoding device according to claim 3, wherein the error signal equalization unit is further configured to amplify a high-frequency component of the equalization error signal.
5. The decoding device according to claim 1, wherein the coefficient updating unit and the target waveform generation unit share a delayer configured to delay the decoded value by one clock.
6. The decoding device according to claim 1, wherein a count of the plurality of partial response coefficients updated by the coefficient updating unit is changeable.

7. The decoding device according to claim 6, wherein the coefficient updating unit is further configured to:
control actuation/stop of a multiplier which is used to update the partial response coefficient; and
change the count of the plurality of partial response coefficients, based on the actuation/stop of the multiplier.
8. A decoding method, comprising:
in a decoding device:
performing, by an equalization unit of the decoding device, on an input signal, partial response equalization that involves convolution of a partial response coefficient of a plurality of partial response coefficients, wherein
the equalization unit is an adaptive equalization unit, and
the partial response equalization is adaptive equalization that causes the partial response coefficient to adaptively follow a characteristic of the input signal;
obtaining, by the equalization unit, an equalized signal based on the partial response equalization of the input signal;
performing, by a maximum likelihood decoding unit of the decoding device, maximum likelihood decoding on the equalized signal, and outputting a decoded value, wherein
the maximum likelihood decoding unit is an adaptive maximum likelihood decoding unit that causes an identification point of the maximum likelihood decoding to adaptively follow the characteristic of the input signal;
generating, by convolution of the partial response coefficient into the decoded value, an equalization target waveform of the adaptive equalization which;
generating, by an error signal generation unit, as an equalization error signal, an error signal between the equalization target waveform and the equalized signal;
updating, by a coefficient updating unit, through least-square-method computation for minimization of a correlation between the decoded value and the equalization error signal, the partial response coefficient;
calculating, by a sum-of-coefficients control unit of the decoding device, a sum of the plurality of partial response coefficients which are used to generate the equalization target waveform; and
controlling, by the sum-of-coefficients control unit, an updating operation at the coefficient updating unit such that the calculated sum falls within a fixed range.
9. A decoding device, comprising:
an equalization unit configured to:
perform, on an input signal, partial response equalization that involves convolution of a partial response coefficient, wherein
the equalization unit is an adaptive equalization unit, and
the partial response equalization is adaptive equalization that causes the partial response coefficient to adaptively follow a characteristic of the input signal; and
obtain an equalized signal based on the partial response equalization of the input signal;
a maximum likelihood decoding unit configured to perform maximum likelihood decoding on the equalized signal, and output a decoded value, wherein
the maximum likelihood decoding unit is an adaptive maximum likelihood decoding unit that causes an identification point of the maximum likelihood decoding to adaptively follow the characteristic of the input signal;

a target waveform generation unit configured to generate, by convolution of the partial response coefficient into the decoded value, an equalization target waveform of the adaptive equalization;

an error signal generation unit configured to generate, as an equalization error signal, an error signal between the equalization target waveform and the equalized signal;

an error signal equalization unit configured to perform equalization on the equalization error signal inputted to a coefficient updating unit; and the coefficient updating unit configured to update, through least-square-method computation for minimization of a correlation between the decoded value and the equalization error signal, the partial response coefficient.

10. A decoding device, comprising:

an equalization unit configured to:
  perform, on an input signal, partial response equalization that involves convolution of a partial response coefficient, wherein
    the equalization unit is an adaptive equalization unit, and
    the partial response equalization is adaptive equalization that causes the partial response coefficient to adaptively follow a characteristic of the input signal; and
  obtain an equalized signal based on the partial response equalization of the input signal;

a maximum likelihood decoding unit configured to perform maximum likelihood decoding on the equalized signal, and output a decoded value, wherein
  the maximum likelihood decoding unit is an adaptive maximum likelihood decoding unit that causes an identification point of the maximum likelihood decoding to adaptively follow the characteristic of the input signal;

a target waveform generation unit configured to generate, by convolution of the partial response coefficient into the decoded value, an equalization target waveform of the adaptive equalization;

an error signal generation unit configured to generate, as an equalization error signal, an error signal between the equalization target waveform and the equalized signal;

a coefficient updating unit configured to update, through least-square-method computation for minimization of a correlation between the decoded value and the equalization error signal, the partial response coefficient, wherein the coefficient updating unit and the target waveform generation unit share a delayer configured to delay the decoded value by one clock.

* * * * *